United States Patent
Patel et al.

(10) Patent No.: US 7,099,065 B2
(45) Date of Patent: Aug. 29, 2006

(54) MICROMIRRORS WITH OFF-ANGLE ELECTRODES AND STOPS

(75) Inventors: Satyadev Patel, Sunnyvale, CA (US); Andrew G. Huibers, Palo Alto, CA (US); Christopher J. Spindt, Menlo Park, CA (US); Peter J. Heureux, Felton, CA (US)

(73) Assignee: Reflectivity, Inc., Sunnyvale, CA (US)

( * ) Notice: Subject to any disclaimer, the term of this patent is extended or adjusted under 35 U.S.C. 154(b) by 45 days.

(21) Appl. No.: 10/437,776

(22) Filed: May 13, 2003

(65) Prior Publication Data

US 2003/0214639 A1 Nov. 20, 2003

Related U.S. Application Data

(63) Continuation-in-part of application No. 10/343,307, filed as application No. PCT/US01/24332 on Aug. 3, 2001, now Pat. No. 6,962,419, which is a continuation-in-part of application No. 09/631,536, filed on Aug. 3, 2000, now Pat. No. 6,529,310, and a continuation-in-part of application No. 09/732,455, filed on Dec. 7, 2000, now Pat. No. 6,447,558, said application No. 10/437,776 and a continuation-in-part of application No. 10/366,297, filed on Feb. 12, 2003, now Pat. No. 6,867,897.

(60) Provisional application No. 60/229,246, filed on Aug. 30, 2000.

(51) Int. Cl.
*G02B 26/00* (2006.01)

(52) U.S. Cl. .................................... 359/291; 359/295

(58) Field of Classification Search ................ 359/290, 359/291, 295, 298, 245, 270; 257/749
See application file for complete search history.

(56) References Cited

U.S. PATENT DOCUMENTS 3,517,126 A 6/1970 Yamada et al.

(Continued)

OTHER PUBLICATIONS

Jaecklin, "Line-Addressable Torsional Micromirrors for Light Modulator Arrays", Sensor and Actuators A, 41-42, Elsevier Science, pp. 324-329, 1994.

(Continued)

*Primary Examiner*—Loha Ben
*Assistant Examiner*—Jack Dinh
(74) *Attorney, Agent, or Firm*—Gregory R. Muir

(57) ABSTRACT

A spatial light modulator is disclosed, along with methods for making such a modulator that comprises an array of mirror devices each having at least a first electrode and a second electrode. The first electrode is designated for driving the mirror plate of the micromirror device to an ON state, and the second electrode is designated for driving the mirror plate to an OFF state. The two electrodes can be disposed on the same side of the mirror plate but on opposite sides of the rotation axis of the mirror plate for driving the mirror plate to rotate in opposite directions. Alternatively, the two electrodes can be disposed on the opposite sides of the mirror plate, but on the same side of the rotation axis of the mirror plate for driving the mirror plate to rotate in opposite directions. The ON state and OFF state of the mirror plate can be defined by stops. The stops may be formed on substrate(s), hinge structures holding the mirror plates of the micromirror device and/or a desired location within the micromirror device. Alternatively, the electrodes for the ON state and the OFF state can be used as stops, either individually or in combination, or in combination with other component(s), such as substrate(s) of the micromirror device. The OFF state angle and the ON state angle are preferably different.

29 Claims, 15 Drawing Sheets

U.S. PATENT DOCUMENTS

| | | |
|---|---|---|
| 3,553,364 A | 1/1971 | Lee |
| 3,600,798 A | 8/1971 | Lee |
| 3,678,196 A | 7/1972 | Roth |
| 3,746,785 A | 7/1973 | Goodrich |
| 3,746,911 A | 7/1973 | Nathanson et al. |
| 3,886,310 A | 5/1975 | Guldberg et al. |
| 4,229,732 A | 10/1980 | Hartstein et al. |
| 4,280,107 A | 7/1981 | Scifres et al. |
| 4,356,730 A | 11/1982 | Cade |
| 4,383,255 A | 5/1983 | Grandjean et al. |
| 4,403,248 A | 9/1983 | Te Velde |
| 4,420,897 A | 12/1983 | Csstleberry |
| 4,492,435 A | 1/1985 | Banton et al. |
| 4,566,935 A | 1/1986 | Hornbeck |
| 4,571,603 A | 2/1986 | Hornbeck et al. |
| 4,592,628 A | 6/1986 | Altman et al. |
| 4,596,992 A | 6/1986 | Hornbeck |
| 4,662,746 A | 5/1987 | Hornbeck |
| 4,677,311 A | 6/1987 | Morita |
| 4,680,579 A | 7/1987 | Ott |
| 4,698,602 A | 10/1987 | Armitage |
| 4,705,361 A * | 11/1987 | Frazier et al. ............... 359/263 |
| 4,710,732 A | 12/1987 | Hornbeck |
| 4,786,149 A | 11/1988 | Hoenig et al. |
| 4,805,038 A | 2/1989 | Seligson |
| 4,954,789 A | 9/1990 | Sampsell |
| 4,956,619 A | 9/1990 | Hornbeck |
| 4,998,262 A | 3/1991 | Wiggers |
| 5,061,049 A | 10/1991 | Hornbeck |
| 5,078,479 A | 1/1992 | Vuilleumier |
| 5,085,497 A | 2/1992 | Um et al. |
| 5,196,767 A | 3/1993 | Leard et al. |
| 5,198,920 A * | 3/1993 | Gobeli et al. ............... 359/245 |
| 5,216,537 A | 6/1993 | Hornbeck |
| 5,285,407 A | 2/1994 | Gale et al. |
| 5,287,215 A | 2/1994 | Warde et al. |
| 5,303,190 A | 4/1994 | Pelley, III |
| 5,311,360 A | 5/1994 | Bloom et al. |
| 5,416,514 A | 5/1995 | Janssen et al. |
| 5,442,414 A | 8/1995 | Janssen et al. |
| 5,444,566 A | 8/1995 | Gale et al. |
| 5,448,314 A | 9/1995 | Heimbuch et al. |
| 5,452,024 A | 9/1995 | Sampsell |
| 5,471,341 A | 11/1995 | Warde et al. |
| 5,493,439 A | 2/1996 | Engle |
| 5,500,759 A * | 3/1996 | Coleman ............... 359/270 |
| 5,508,738 A | 4/1996 | Janssen et al. |
| 5,517,347 A | 5/1996 | Sampsell |
| 5,535,047 A | 7/1996 | Hornbeck |
| 5,552,925 A | 9/1996 | Worley |
| 5,557,177 A | 9/1996 | Engle |
| 5,567,334 A | 10/1996 | Baker et al. |
| 5,579,149 A | 11/1996 | Moret et al. |
| 5,579,151 A | 11/1996 | Cho |
| 5,583,688 A | 12/1996 | Hornbeck |
| 5,631,782 A | 5/1997 | Smith et al. |
| 5,636,070 A | 6/1997 | Ji et al. |
| 5,669,687 A | 9/1997 | Yang |
| 5,677,784 A | 10/1997 | Harris |
| 5,706,061 A | 1/1998 | Marshall et al. |
| 5,745,193 A | 4/1998 | Urbanus et al. |
| 5,768,009 A | 6/1998 | Little |
| 5,774,196 A | 6/1998 | Marshall |
| 5,777,390 A * | 7/1998 | Berger et al. ............... 257/749 |
| 5,784,190 A | 7/1998 | Worley |
| 5,808,780 A | 9/1998 | McDonald |
| 5,835,256 A | 11/1998 | Huibers |
| 5,926,309 A | 7/1999 | Little |
| 5,999,306 A * | 12/1999 | Atobe et al. ............... 359/295 |
| 6,025,951 A * | 2/2000 | Swart et al. ............... 359/245 |
| 6,046,840 A | 4/2000 | Huibers |
| 6,053,617 A | 4/2000 | Kaeriyama |
| 6,107,115 A | 8/2000 | Atobe et al. |
| 6,356,378 B1 | 3/2002 | Huibers |
| 6,406,148 B1 | 6/2002 | Marshall et al. |

OTHER PUBLICATIONS

Gerhard-Multhaupt et al., "Light-Valve Projection Displays—An Introduction", Displays, vol. 16, No. 1, 1995, Elsevier Science B.V., pp. 5-7.

Gerhard-Multhaupt, "Light-Valve Technologies for High-Definition Television Projection Displays", Displays, 1991, vol. 12, No. 3/4, pp. 115-128.

Peterson, K.E., "Micromechanical Light Modulator Array Fabricated on Silicon", Applied Physics Letters, American Institute of Physics, vol. 31 No. 8, Oct. 15, 1977, pp. 521-523.

Cadman et al., "New Micromechanical Display Using Metallic Thin Films", IEEE Electron Device Letters, Jan. 1983, vol. EDL-4 No. 1, pp. 3-4.

Thomas et al., "The Mirror Matrix Tube: A Novel Light Valve for Projection Displays", IEEE Transactions on Electron Devices, vol. Ed-22 No. 9, Sep. 1975, pp. 765-775.

Hornbeck, "Digital Light Processing (TM) for High-Brightness, High Resolution Applications", Texas Instruments, Inc., date unknown, pp. 1-14.

Yoder, "The Digital Display Technology of the Future", Texas Instruments, Inc., date unknown, pp. 1-11.

Peterson, "Silicon Torsional Scanning Mirror", IBM J. Res. Develop., vol. 24 No. 5, Sep. 1980 pp. 631-637.

Roy G. Gordon, Criteria for Choosing Transparent Conductors, Mrs Bulleint/Aug. 2000. pp. 52-57.

Bryan G. Lewis, et al., Applications and Processing of Transparent Conducting Oxides Mrs Bulleint/Aug. 2000. pp. 22-27.

* cited by examiner

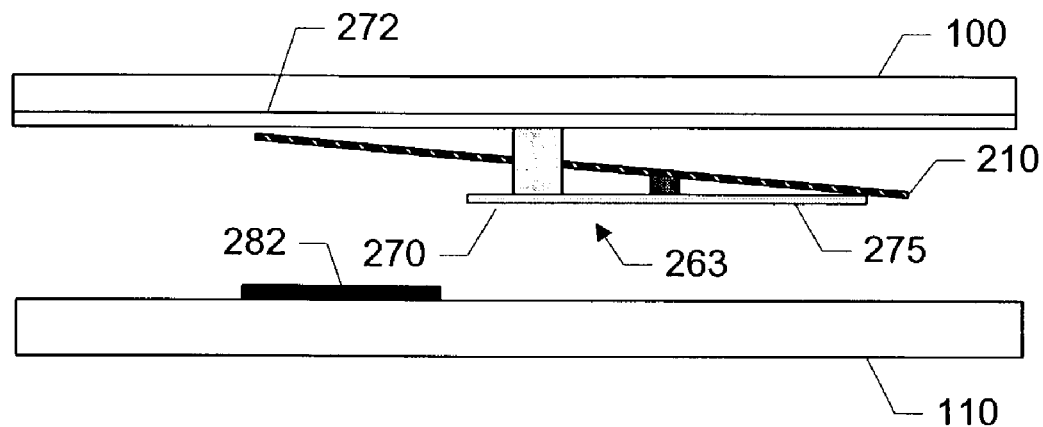
FIG. 8C     "Off"-state
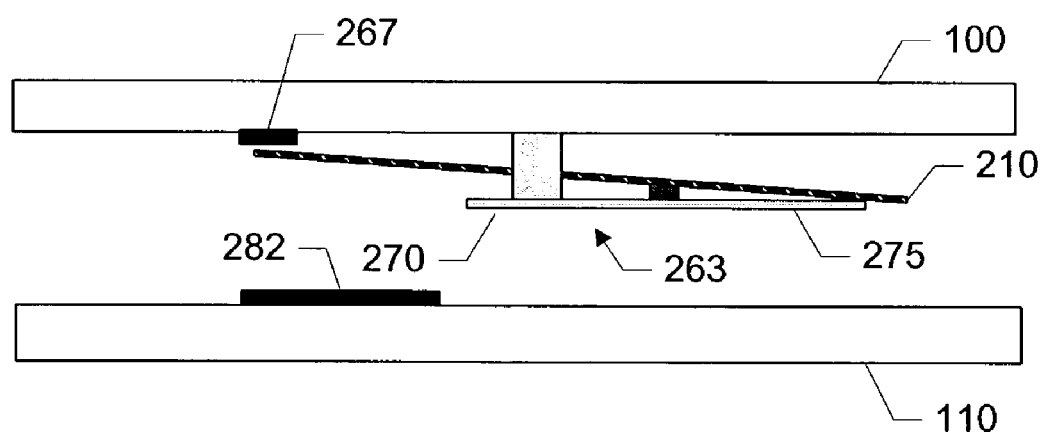
FIG. 8D     "Off"-state

MICROMIRRORS WITH OFF-ANGLE ELECTRODES AND STOPS

CROSS REFERENCE TO RELATED CASES

This application is a continuation-in-part of U.S. patent application Ser. No. 10/343,307 to Huibers et al., filed Jan. 29, 2003 now U.S. Pat. No. 6,962,419, which is a US national phase application of PCT/US01/24332 filed Aug. 3, 2001, which is a continuation-in-part and claims priority of U.S. patent application Ser. Nos. 09/631,536 filed Aug. 3, 2000, 60/229,246 filed Aug. 30, 2000 and 09/732,455 filed Dec. 7, 2000, and a continuation-in-part of U.S. patent application Ser. No. 10/366,297 to Patel filed Feb. 12, 2003. The subject matter of these applications is incorporated herein by reference.

TECHNICAL FIELD OF THE INVENTION

The present invention is related generally to the art of microelectromechanical systems, and, more particularly, to micromirrors with mechanisms defining OFF-states and ON states of the micromirrors and electrodes for actuating micromirrors.

BACKGROUND OF THE INVENTION

The present invention relates to reflective micromirrors and micromirror array devices for, e.g., projection-type displays, for steering light beams, maskless lithography, maskless micro-array production, etc. A common feature is a micromirror that is movable so as to deflect incident light. In one type of conventional direct view or projection-type display system, an array of reflective micro-mirrors is provided for producing an image. Typically the micromirrors have either a tilt angle for the "ON" state and a non-deflected state for the "OFF" state, or the same tilt angles for "ON" and "OFF" states but with opposite sign.

As an exemplary application for displaying an image, a micromirror is associated with a pixel of an image. At a time when the pixel is "bright", a micromirror is set to the "ON" state. Incident light is reflected by the micromirror into a cone of reflected light towards the projection lens or the display target. At another time when the pixel turns to "dark", the micromirror is set to the "OFF" state. Incident light is reflected into another cone of reflected light away from the projection lens and the display target. However, when the cone of the reflected light by the micromirror in the ON state and the cone of the reflected by the micromirror in the OFF state are too close, e.g., the angle between the two light cones is too small, the two light cones may be overlapped. The contrast ratio of the pixel, thus the quality of the displayed image is reduced (contrast ratio is the ratio of luminance between the brightest white that can be produced and the darkest black that can be produced). And it is a major determinant of perceived image quality. If a displayed image has high contrast ratio, a viewer will judge it to be sharper than a displayed image with lower contrast ratio, even if the lower contrast image has substantially more measurable resolution. The degradation of the contrast ratio becomes larger as the angular extent of the incident beam grows.

Therefore, what is needed is a spatial light modulator that has a high resolution, a high fill factor and a high contrast ratio. What is further needed is a spatial light modulator that does not require polarized light, hence is optically efficient and mechanically robust.

SUMMARY OF THE INVENTION

In an embodiment of the invention, a spatial light modulator is disclosed. The spatial light modulator comprises: an array of pixels, each pixel comprising micromirrors on a substrate, each micromirror comprising a reflective plate held by a hinge and being movable by more than one electrode, each micromirror movable by a first electrode for moving the micromirror to an ON position at an angle from a non-actuated position, and a second electrode for moving the micromirror to an OFF position that is at a negative angle compared to the ON angle and relative to a 0 angle non-deflected rest position, the second electrode being disposed on a side of the reflective plate opposite to that of the first electrode.

In another embodiment of the invention, a spatial light modulator is disclosed that comprises: an array of micromirrors on a substrate, each micromirror comprising a reflective plate being movable by more than one electrode, a first electrode for moving the micromirror to an ON position at an angle of 10 degrees or more from a non-actuated position, and a second electrode for moving the micromirror to an OFF position that is at an angle of from −1 to −8 degrees, wherein a micromirror stop is disposed on a side of the reflective plate opposite to that of the substrate, the reflective plate abutting the stop at a predetermined distance from the substrate and at an angle of from −1 to −8 degrees. Another stop may be provided for arresting movement of the mirror plate at the ON position.

In yet another embodiment of the invention, a spatial light modulator is disclosed. The spatial light modulator comprises: an array of micromirrors on a substrate, each micromirror comprising a reflective plate being movable by more than one electrode, a first electrode for moving the micromirror to an ON position at an angle of 10 degrees or more from a non-actuated position, and a second electrode for moving the micromirror to an OFF position that is at an angle of from −1 to −8 degrees, the second electrode being disposed on a side of the reflective plate opposite to that of the first electrode; and wherein a micromirror stop is disposed on a side of the reflective plate opposite to that of the substrate, the reflective plate abutting the stop at a predetermined distance from the substrate and at an angle of from −1 to −8 degrees.

In another embodiment of the invention, a spatial light modulator is disclosed. The spatial light modulator comprises: an array of pixels, each pixel comprising a micromirror held via hinges and capable of movement upon application of an electrostatic force, a first electrode for moving the micromirror to an ON position and a second electrode disposed on a side of the micromirror opposite to that of the first electrode for moving the micromirror to an OFF position.

In yet another embodiment of the invention, a spatial light modulator is disclosed. The spatial light modulator comprises: an array of pixels, each pixel comprising a micromirror held via hinges and capable of movement upon application of an electrostatic force, a first electrode for moving the micromirror to an ON position, a first stop for stopping the micromirror at a predetermined ON angle, and a second stop for stopping the micromirror at a predetermined OFF angle that is in the opposite direction from a non-deflected state of the micromirror and less than the ON angle.

In yet another embodiment of the invention, a spatial light modulator is disclosed. The spatial light modulator comprises: an array of micromirrors on a visible light transmissive substrate, each micromirror comprising a micromirror plate held by a hinge on the light transmissive substrate and further comprising a first stopping point for stopping the micromirror at a predetermined angle in an ON position, and a second stopping point for stopping the micromirror at a predetermined angle in an OFF position.

BRIEF DESCRIPTION OF DRAWINGS

While the appended claims set forth the features of the present invention with particularity, the invention, together with its objects and advantages, may be best understood from the following detailed description taken in conjunction with the accompanying drawings of which:

FIG. 8c is a cross-section view of a micromirror device having a glass substrate with a visible light transparent electrode film deposited thereon for deforming the micromirrors to an OFF state according to an embodiment of the invention;

FIG. 8D is a cross-section view of a micromirror device having an electrode formed on the glass substrate for driving the mirror plate to rotate to an OFF state of the micromirror device according to an embodiment of the invention;

FIG. 9b is a cross-section view of a triple layer structure of the micromirror device of FIG. 9a;

FIG. 9c is a cross-section view of a six-layer structure of the micromirror device of FIG. 9a;

FIG. 10b schematically illustrates a micromirror array device having an array of micromirrors of FIG. 10a;

DETAILED DESCRIPTION OF THE EMBODIMENTS

Figure 1:
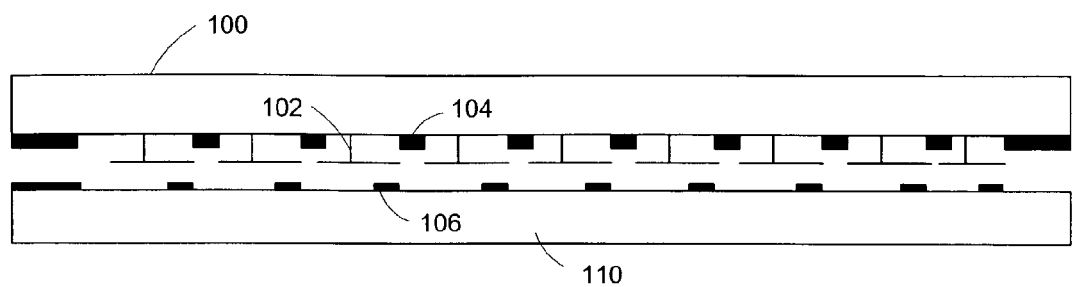
FIG. 1 is a cross-section view of a micromirror array device having two sets of electrodes for deforming the micromirror plates of the micromirror array device according to an embodiment of the invention.

The present invention discloses a micromirror array device having an array of micromirrors. Each micromirror comprises at least two electrodes for driving the micromirror plate to an ON state and an OFF state. The electrodes can be disposed on the same side relative to the micromirror plate but on opposite sides relative to the rotation axis of the mirror plate. Alternatively, all electrodes for the OFF state of all micromirrors can be formed as an electrode film deposited on the substrate on which the micromirrors are formed. This electrode film can also be an anti-reflection film for enhancing the transmission of light through the substrate. In order to reduce scattering and enhancing reflection of light, the ON state angle corresponding to the ON state is defined as different as the OFF state angle corresponding to the OFF state. In particular, the OFF state angle is smaller than the ON state angle and in the opposite direction of the ON state angle relative to a non-deflected state of the mirror plate. This asymmetric OFF state angle and ON state angle can be achieved by proper combinations of the electrodes with a plurality of rotation stopping mechanisms. For example, electrodes for the ON state and the OFF state can be used as the stops for the ON state and the OFF state. These electrodes are generally coated with dielectric materials for electrically isolating the electrode to avoid electric shorting. With proper geometric configurations of the electrodes, desired asymmetric OFF state angle and ON state angle can be obtained. For another example, designated stops for the ON state and/or the OFF state can be provided for defining the OFF state angle and the ON state angle. These stops can be formed on the substrate(s) and/or the hinge structure that holding the mirror plates. The electrodes of the second electrode array is preferably connected and forms a continuous electrode such that all electrodes of the second electrode "array" always stay at the same electric potential. In an operation, the electrodes of the second electrode array (the "second electrode") may be initiated by applying an electric potential between said electrodes and the mirror plates, and in response to this electric potential, all mirror plates are rotated to the OFF state. Then in response to an actuation signal, selected mirror plate(s) is (are) rotated to the ON state in response to an electric filed between the selected mirror plate(s) and the electrode(s) for the ON state. Apparently, in order to switch the mirror plate from the OFF state to the ON state, the electric force applied to the mirror plate by the electrode for the ON state should overcome the electric force applied to the mirror plate by the electrode for the OFF state.

In the following, embodiments of the present invention will be discussed in detail with reference to drawings. It should be understood by those skilled in the art that the following discussion is for demonstration purposes only and should not be interpreted in any ways as a limitation on the present invention.

Turning to the drawings, FIG. 1 illustrates a cross-section view of a micromirror array device according to an embodiment of the invention. The micromirror array device comprises an array of micromirrors (e.g. micromirror 102) that is formed on substrate 100, such as glass or quartz that is transparent to visible light. An array of electrodes (e.g. electrode 106) and circuitry (not shown) is formed on substrate 110 and disposed proximate to the array of micromirrors for electrostatically deforming the micromirrors. For example, an electrostatic field is established between each mirror plate of the micromirror device and an electrode of the electrode array. In response to the established electrostatic field, the mirror plate rotates relative to substrate 100 to an ON state such that reflected light from the mirror plate at the ON state can be collected by a projection lens (e.g. projection lens 106 in FIG. 13a) for displaying images in a display target. The rotation angle of the mirror plate at the ON state relative to substrate 100 is referred to as the ON state angle. Hereafter, when referring to the ON and OFF angles (or such angles relative to the substrate), a sign of the angle will be used (positive or negative relative to the substrate). The sign is arbitrary, but signifies that the micromirrors rotate in one direction to an ON position and in an opposite direction to an OFF position. In the following, the ON state angle will be represented by an angle value with a plus sign (+), and the OFF state angle will be represented by an angle value with a minus sign (−). In a preferred embodiment of the invention, the ON state angle is +10° degrees or more, preferably +14° or more, and more preferably, +16° degrees or more.

In addition to electrode array 106 on substrate 110, a second electrode or electrode array is formed on substrate 100 for driving the mirror plates to an OFF state. In the preferred embodiment of the invention, the OFF state angle is −1° or less (the absolute value of the angle is greater than 1), preferably −2° degrees or less, and more preferably around −4° degrees. In order to drive the mirror plates to the OFF state angle, the second electrode or electrode array is disposed on the glass substrate 100 in one embodiment of the invention. In particular, each electrode (e.g. electrode 104) of the second electrode or electrode array is disposed on a side of a mirror plate opposite to that of an electrode (e.g. electrode 106) of the first electrode array that is formed on substrate 110, and the two electrodes (e.g. electrodes 104 and 106) are on the same side relative to the rotation axis of the mirror plate (e.g. mirror plate 102). In operation, a first electric voltage $V_1$ (thus a first electric field) is applied between the mirror plate (e.g. mirror plate 102) and the electrode (e.g. electrode 106) of the first electrode array. In response to the first electric field, the mirror plate (e.g. mirror plate 102) rotates (clockwise in the given configuration as shown in the figure) relative to substrate 100 to the ON state. In order to drive the mirror plate (e.g. mirror plate 102) to rotate (counter-clockwise in the given configuration as shown in the figure) to the OFF state relative to substrate 100, a second electric voltage $V_2$ (thus a second electric field) is applied between the mirror plate (e.g. mirror plate 102) and the electrode (e.g. electrode 104) of the second electrode array on substrate 100. As an alternative embodiment of the invention, the micromirror array (e.g. micromirror 102) can be formed on substrate 110, which is a semiconductor wafer. The electrode array on substrate 110 drive the mirror plates to rotate to the ON state, and the electrode array on the glass substrate 100 drive the mirror plates to rotate to the OFF state.

Figure 2:
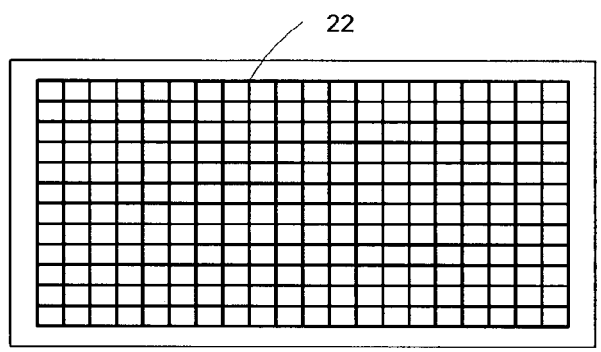
FIG. 2 is a top view of the micromirror array device of FIG. 1.

Because the second electrode or electrode array is formed on the glass substrate 100 and exposed to light incident on the mirror plates, the second electrode or array of electrodes can be comprised of light absorbing materials and form a light absorbing grid around each micromirror plate (preferably interconnected as a grid), and more particularly, between adjacent mirror plates, as shown in the figure. A top view of such electrode and light absorbing grid 22 deposited on a surface of substrate 100 is illustrate in FIG. 2. As can be seen in FIG. 2, the electrode "array" on substrate 100 is in fact a single electrode formed as a grid. Such a grid electrode can also be provided as a series stops (e.g. electrode 104, being a cross-section of an electrode "strip" extending along a length (or width) of the micromirror array.

Figure 3:
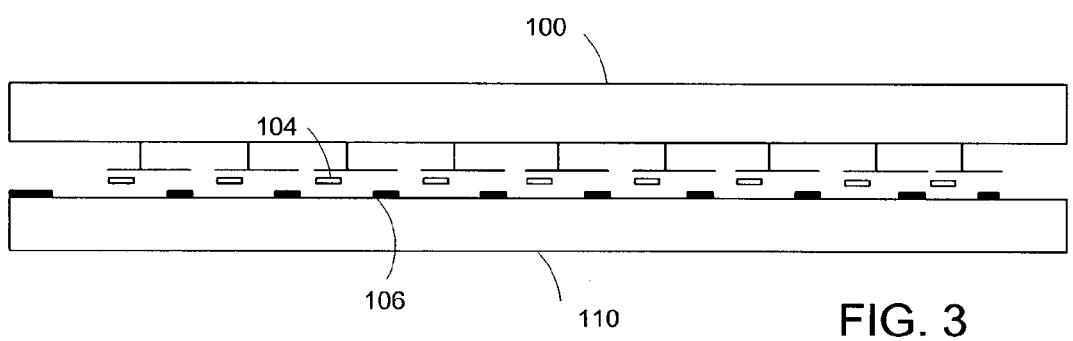
FIG. 3 is a cross-section view of a micromirror array device having two sets of electrodes for deforming the micromirror plates of the micromirror array device according to another embodiment of the invention.

Rather than forming the second electrode or electrode array for the OFF state of the micromirror devices on the glass substrate, the second electrode or electrode array can also be formed on the same side as the first electrode array relative to the mirror plates, as shown in FIG. 3. Specifically, the second array of electrodes (e.g. electrode 104) can be formed on the same side of the mirror plates (e.g. mirror plate 102) as the first array of electrodes (e.g. electrode 106), but on opposite sides of the rotation axis of the mirror plate (e.g. mirror plate 102). In operation, two different voltages are respectively applied between the mirror plate and the first electrode for driving the mirror plate to rotate to the ON state, and between the mirror plate and the second electrode for driving the mirror plate to rotate to the OFF state. As an alternative embodiment of the invention, the micromirror array (e.g. micromirror 102) can be formed on substrate 110, which is a semiconductor wafer. The electrode array on substrate 110 drive the mirror plates to rotate to the ON state, and the second electrode or electrode array drive the mirror plates to rotate to the OFF state.

Figure 4:
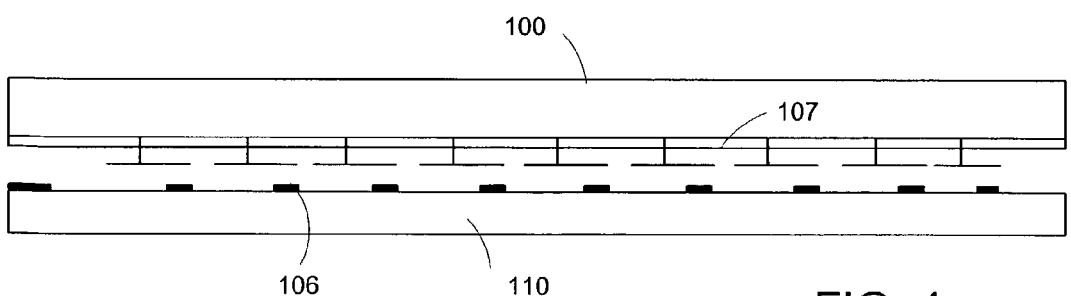
FIG. 4 is a cross-section view of a micromirror array device having two sets of electrodes for deforming the micromirror plates of the micromirror array device according to yet another embodiment of the invention.

In yet another embodiment of the invention, the second electrode or electrode "array" can be formed on the glass substrate 100 as an electrode film as shown in FIG. 4. Referring to FIG. 4, electrode film 107 is deposited on the lower surface of the glass substrate 100, the lower surface facing the mirror plates of the micromirror devices. In this situation, electrode film 107 is electrically conducting (or at least on layer is electrically conducting if electrode film 107 is a laminate) and transparent to visible light. More preferably, the electrode film can also be an anti-reflection (AR) film. During operation, a voltage is applied between electrode film 107 and the mirror plate, yielding an electrostatic field being established between the electrode film and the mirror plates for driving the mirror plates to rotate (counter-clockwise in the given configuration as shown in the figure) to an OFF state if the adjacent electrode 106 is not set to actuated the mirror to the ON state. The mirror plates can rotate (clockwise in the given configuration as shown in the figure) to an ON state in response an electric field established between the mirror plate and the first electrode, even if a voltage is applied to electrode film 107. As an alternative embodiment of the invention, the micromirror array (e.g. micromirror 102) can be formed on substrate 110, which is a semiconductor wafer. The electrode array on substrate 110 drive the mirror plates to rotate to the ON state, and electrode film 107 on the glass substrate 100 drive the mirror plates to rotate to the OFF state.

This type of definition for the OFF state with a non-zero OFF state angle surely benefits the performance of the micromirror devices in many aspects, such as contrast ratio. The OFF state angle and the ON state angle can be the same value but with opposite sign. However, when the OFF state angle is too large, performance of the micromirror devices will be degraded, which will be discussed in detail with reference to FIG. 5a through FIG. 5i.

Figure 5A:
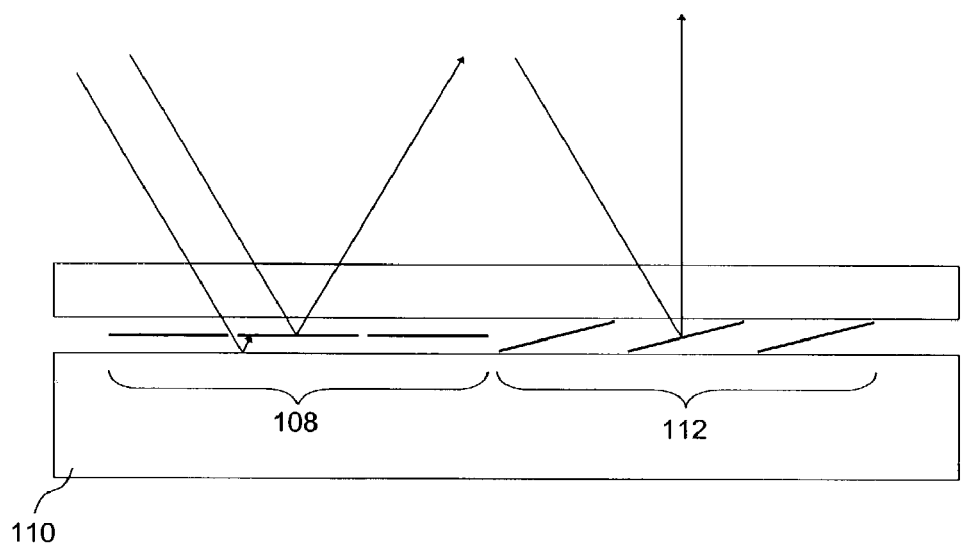
FIG. 5a through FIG. 5c schematically illustrate micromirrors having a flat non-deflected OFF state.
Figure 5B:
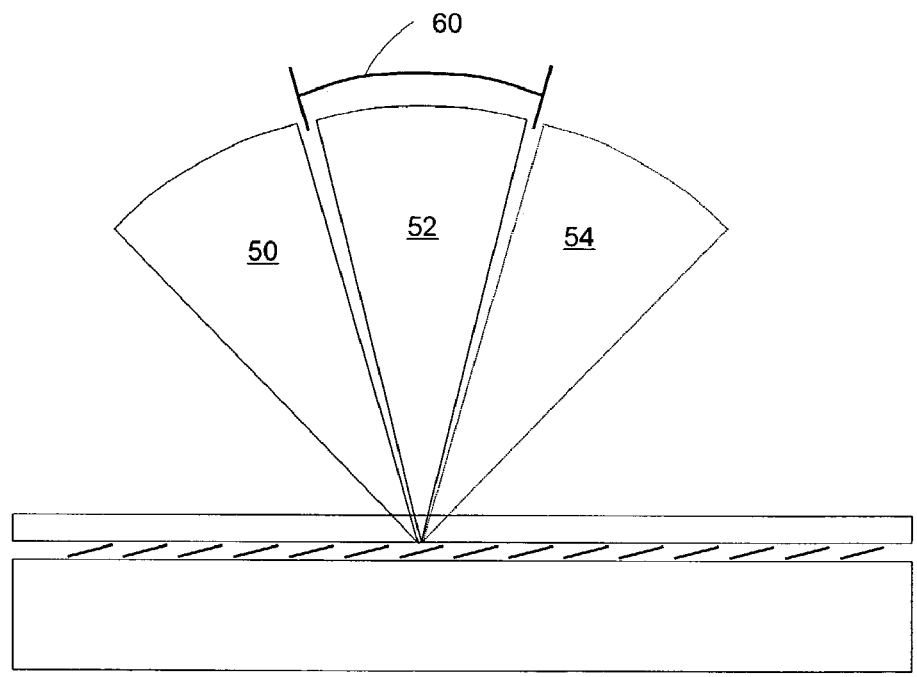
Figure 5C:
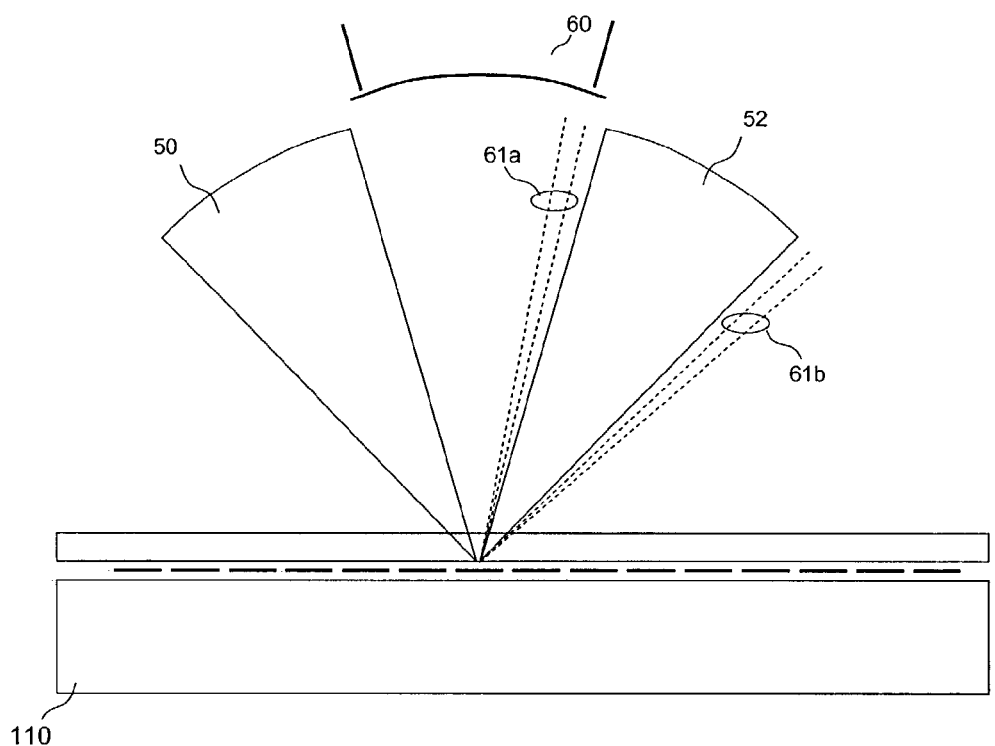

Referring to FIG. 5a, a cross sectional view of multiple micromirrors within an array where micromirrors in their OFF state are not deflected (group 108) whereas micromirrors in their ON state (group 112) are moved from the flat state so as to project light where the light can be viewed (directly, on a target within a unitary device, across a room onto a screen, etc.). Such a micromirror array arrangement is better illustrated in FIGS. 5b and 5c. As can be seen in FIG. 5B, in the micromirrors' ON state, an incoming cone of light 50 is reflected off of the micromirrors (all micromirrors are ON in this figure) and light is projected away as a cone of light 52 into output aperture 60, and in most cases will proceed to an imaging system (e.g., a projection lens or lenses). Cone 54 represents specula reflection from the transparent cover. FIG. 5c is an illustration of the micromirrors in their OFF state, wherein cone 52 represents light reflected from the micromirrors in this OFF state. The incident and reflected cones of light will narrow onto the entire array, though in these figures, for ease of illustration, the cones of light are shown as tapering onto an individual micromirror.

The arrangement of FIG. 5b and FIG. 5c has the benefit that when the micromirrors are in their OFF (non-deflected) state, little light is able to travel through the gaps between the micromirrors and cause undesirable "gap scatter". However, as shown in FIG. 5c, diffracted light is caused by the repeating pattern of the micromirrors (light 61a and 61b that extends beyond the cone of reflected OFF light 52). This undesirable light is caused by scattering or diffraction from the edges of the micromirrors ("edge scatter"). In particular, because the incoming cone of light (and thus the outgoing cones of light) is made as large as possible so as to increase efficiency, diffraction light such as light 61a that extends beyond the cone of reflected OFF light can enter the output aperture 60 (e.g., collection optics) and undesirably decrease contrast ratio.

Figure 5D:
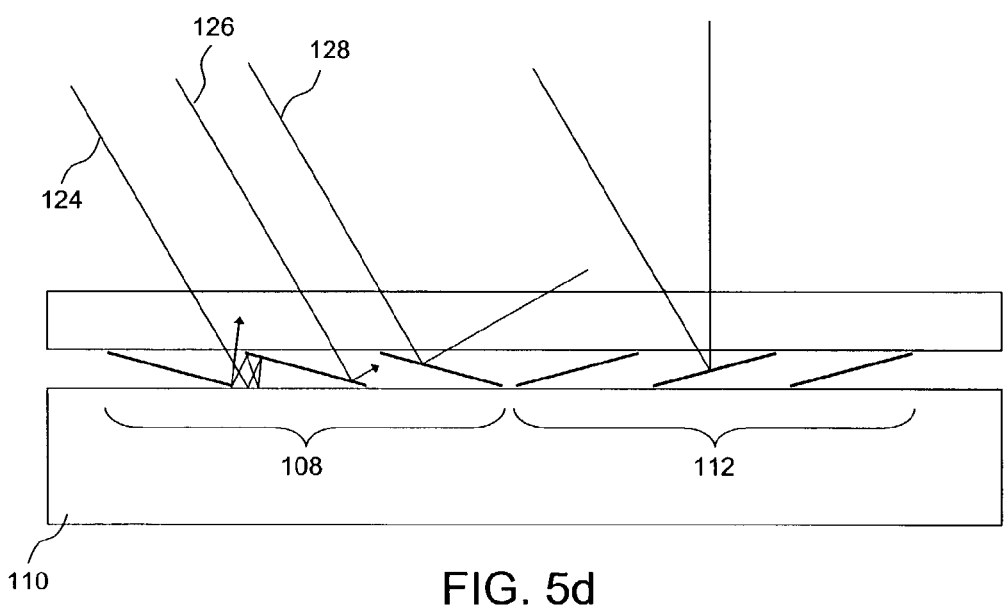
FIG. 5d through FIG. 5f schematically illustrate micromirrors having deflected ON and OFF states of equal angles.
Figure 5E:
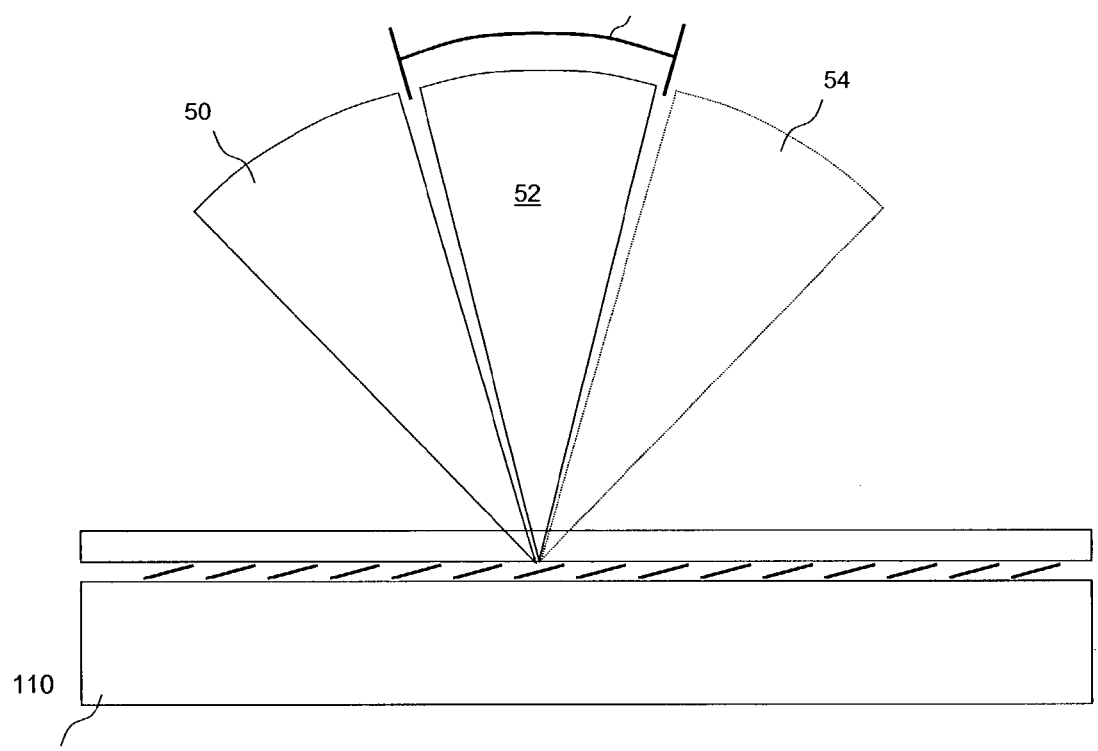
Figure 5F:
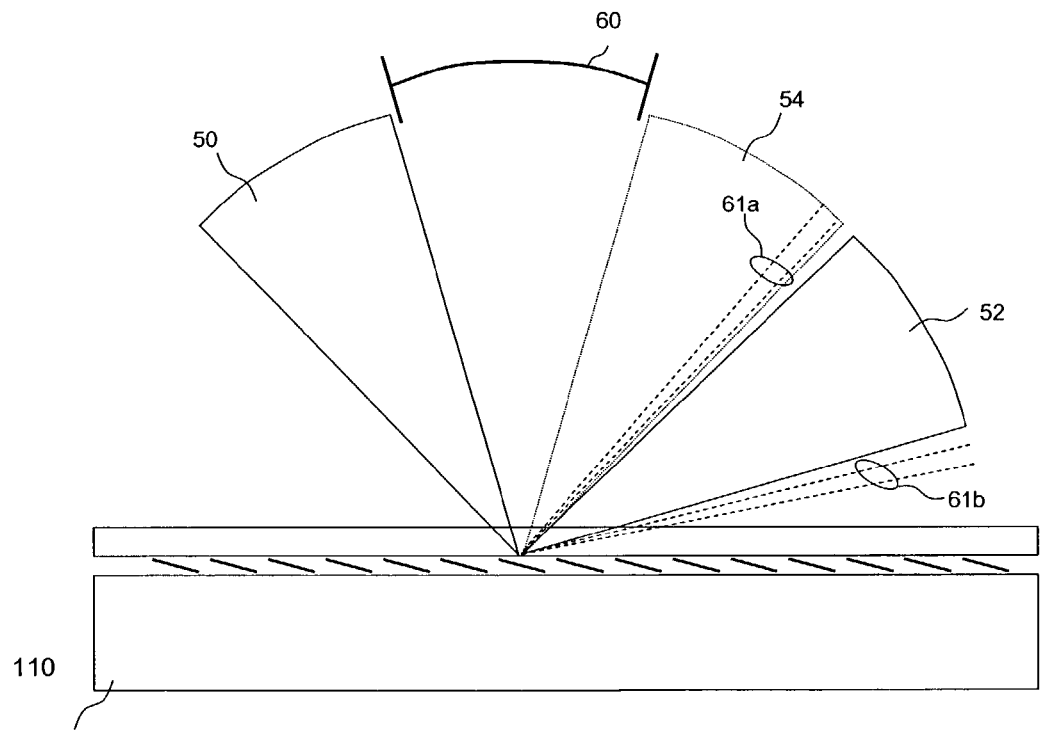

In order to avoid this "overlap" of OFF state light (including diffraction light) and ON state light that decreases contrast ratio, the OFF state light and ON state light can be separated further from each other by deflecting micromirrors for both the ON and OFF states. As can be seen in FIG. 5d, if the micromirror is deflected in its 'off' state as illustrated in this figure, some light will be properly reflected off of the micromirrors far away from the ON state direction (e.g., collection optics) as shown as ray 128. Other light 124 will not hit on a micromirror, but will scatter on the top surface of the lower substrate (e.g., on lower circuitry and electrodes) and enter into the collection optics even though the adjacent micromirror is in the OFF state. Or, as can be seen by ray 126, the incoming light could hit a micromirror, yet still result in gap scatter rather than being properly directed in the OFF angle like ray 128. This ON arrangement as illustrated in FIG. 5e is the same as in FIG. 5b. However, as illustrated in FIG. 5f, the OFF state along with diffraction 61a caused by micromirror periodicity, is moved further away from the ON angle so as to result in improved contrast ratio due to diffraction/edge scatter (though decreased contrast ratio due to gap scatter, as mentioned above).

An improved micromirror array would maximize the distance between the OFF light cone and the ON light cone (minimize edge scatter into the acceptance cone), yet minimize gaps between adjacent micromirrors (minimize gap scatter). One solution that has been tried has been to provide a micromirror array with micromirrors that deflect in opposite directions for the ON and OFF states as in FIG. 5d to FIG. 5f, and provide a light absorbing layer under the micromirrors so as to decrease gap scatter. Unfortunately, this increases process complexity, or absorbs light onto the micromirror array assembly (onto the light valve), which increases the temperature of the light valve and causes problems due to thermal expansion, increased fatigue or droop of micromirror structures, increased breakdown of passivation films, self assembled monolayers and/or lubricants, etc.

Figure 5G:
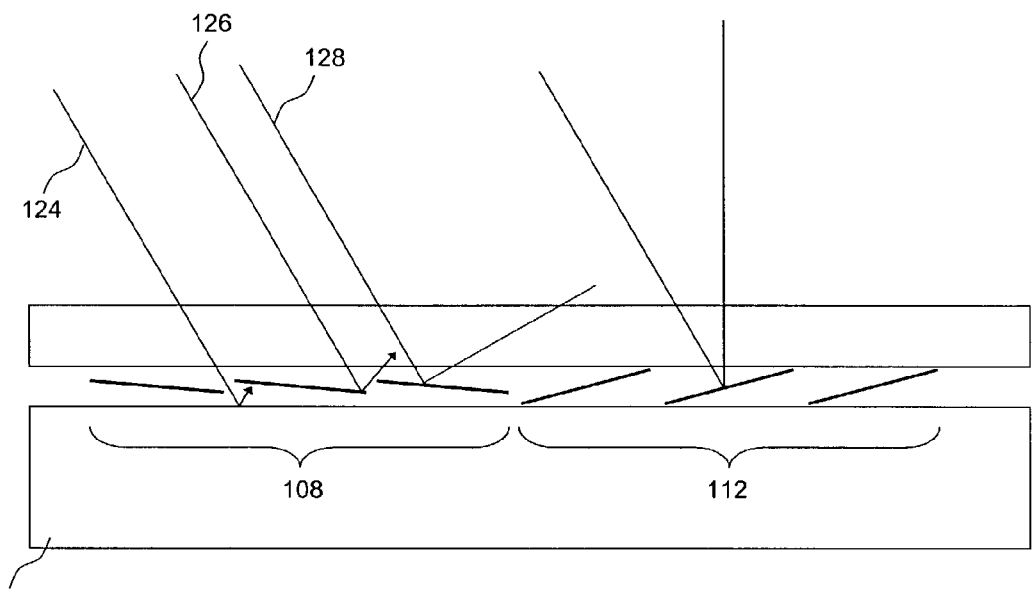
FIG. 5g through FIG. 5i schematically illustrate micromirrors having a greater angle for the ON state than the angle for the OFF state.
Figure 5H:
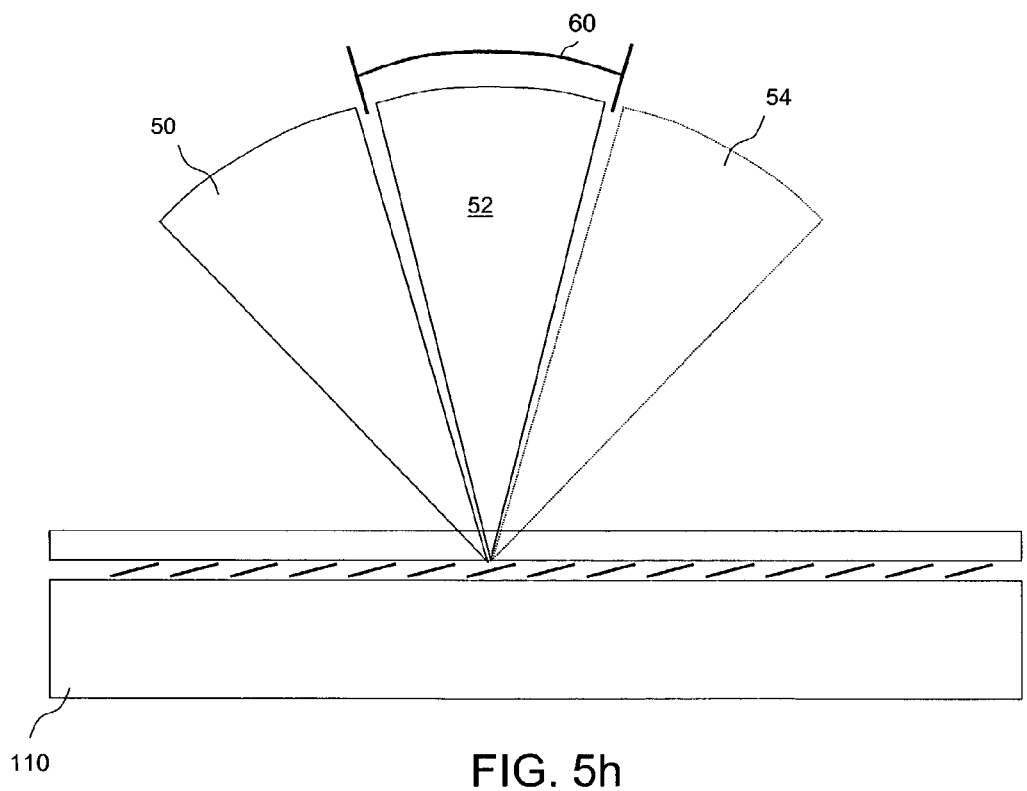
Figure 5I:
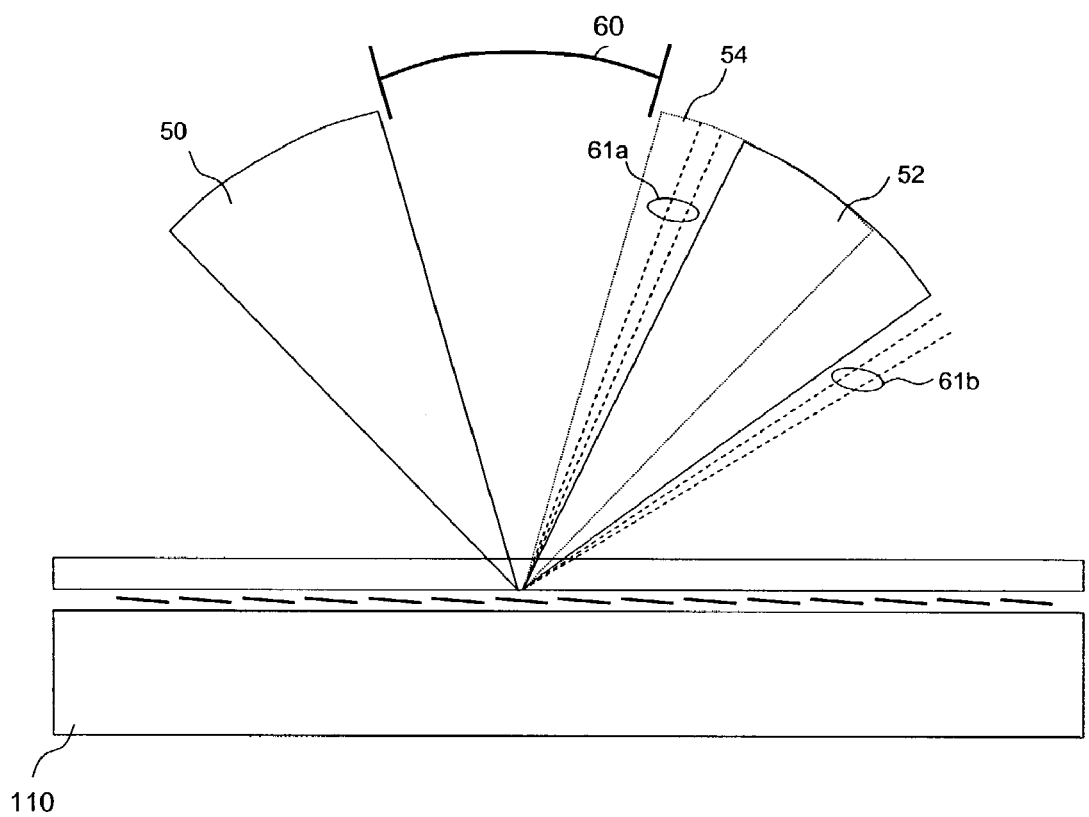

As can be seen in FIG. 5g to FIG. 5i micromirrors are provided that are deflected in both their ON and OFF states, yet at different deflection angles. As can be seen in FIG. 5g micromirrors 108 are deflected in an OFF state that is at a deflection angle less than micromirrors 112 in their ON state (deflected in an opposite direction from the flat or non-deflected position). As can be seen in FIG. 5h, the ON state is unchanged (incoming light 50 projected as outgoing light 52 into output aperture 60), with some specular reflection 54. In FIG. 5i, micromirrors are in their OFF state in a sufficiently deflected position such that edge scattering light 61a that passes into output aperture 60 is minimized, yet deflected only so much as to keep such edge scattering light out of the acceptance cone so as to minimize gap scattering light from under the micromirrors due to a large OFF state deflection angle.

Figure 6A:
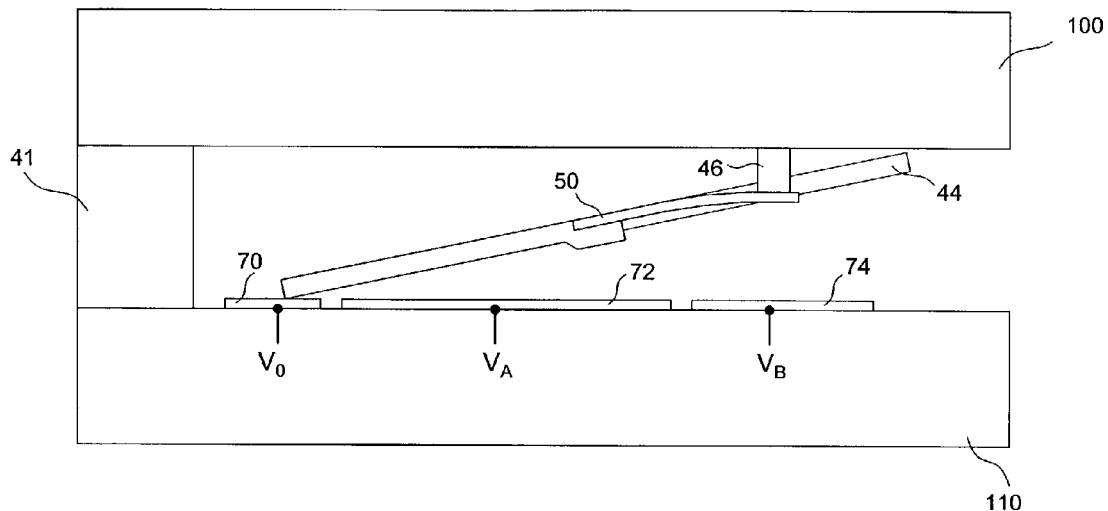
FIG. 6a and FIG. 6b schematically illustrate a micromirror plate having an ON state and an OFF state, wherein the ON state is defined as the micromirror plate is stopped by the substrate on which the electrodes are formed (6a); and wherein the OFF state is defined as the micromirror plate is stopped by the glass substrate on which the micromirror plate is formed (6b)
Figure 6B:
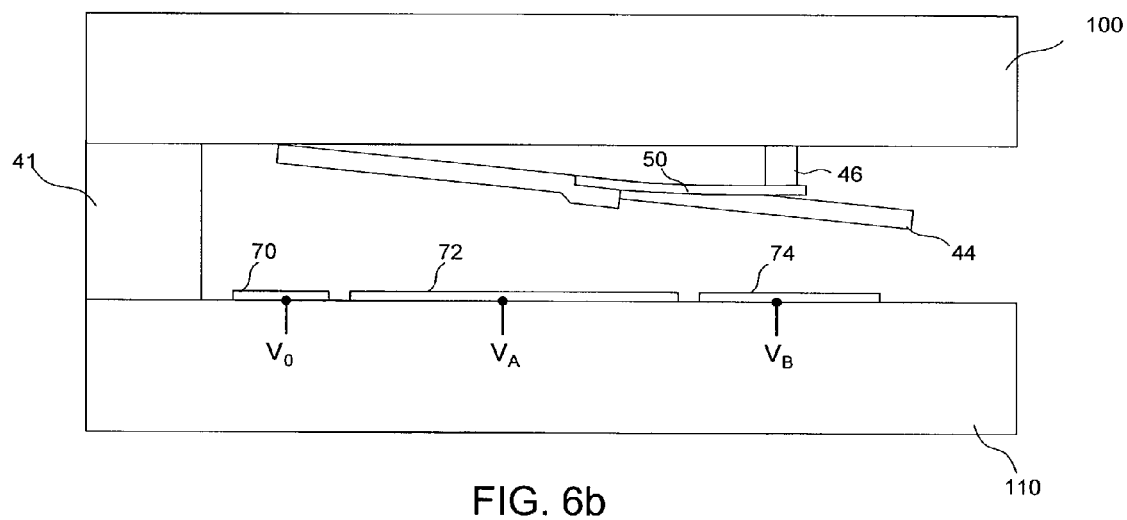

In order to obtain different rotation angles corresponding to the ON state and the OFF state, an asymmetric rotation of the mirror plates is disclosed in this invention. Referring to FIG. 6a, a cross-section view of a micromirror device according to an embodiment of the invention is illustrated therein. As can be seen, three electrodes, 70, 72 and 74, which are formed on substrate 110, are provided and disposed proximate to mirror plate 44, which is formed on glass substrate 100. Electrode 72 and 74 are provided for deforming the mirror plate in opposite rotation directions. As an alternative feature of the embodiment of the invention, electrode 70 is provided for allowing the mirror plate to stop rotation by hitting a material at the same potential as the mirror plate itself. When a voltage $V_A$ is applied to electrode 72, mirror plate 44 is deflected until it impacts electrode 70. This is the ON position of the mirror plate that allows light to enter into the collection optics of the system. It is possible to design the gap between the substrates (i.e. substrates 110 and 100) such that the ends of mirror plate 44 impact electrode 70 and substrate 100 at the same time. When a voltage $V_B$ is applied to electrode 74, mirror plate 44 deflects in the opposite direction until the end of the mirror plate impacts substrate 100. This is the OFF position of the micromirror, as shown in FIG. 6b. Due to the position of the hinge 50 and post 46, the angle of the micromirror in this OFF position is less than the angle of the micromirror in the ON position.

Figure 7A:
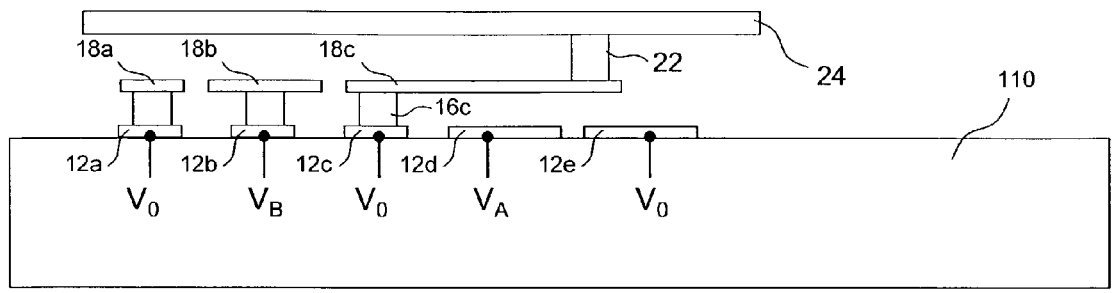
FIG. 7a through FIG. 7c schematically illustrate a non-deflected state (7a), an ON state (7b) and an OFF state (7c) of a micromirror plate according to an embodiment of the invention.
Figure 7B:
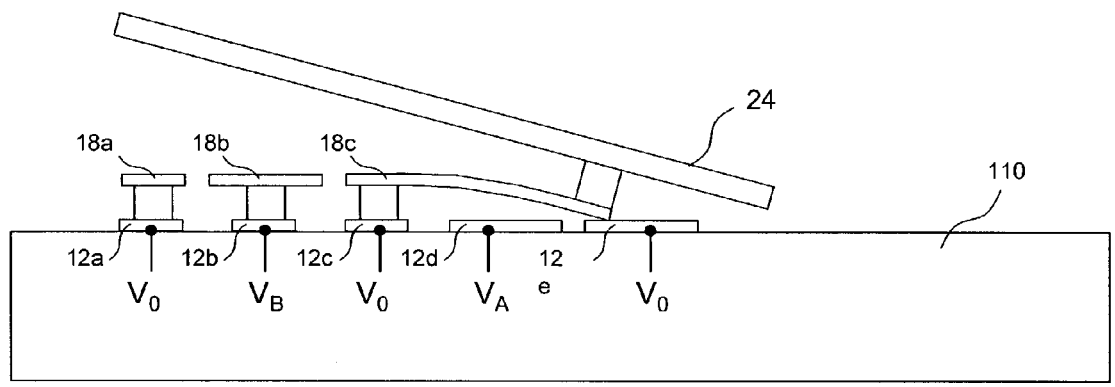
Figure 7C:
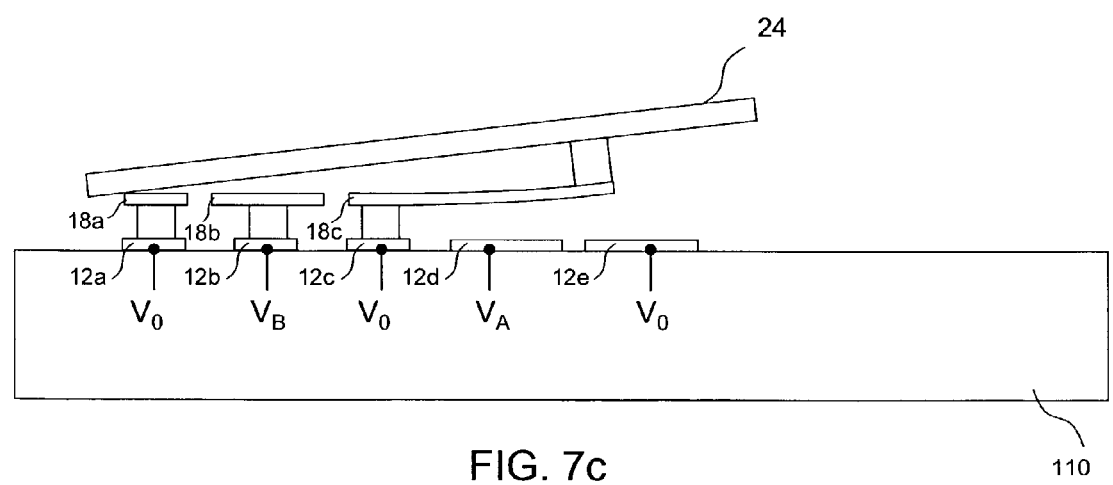
Figure 9A:
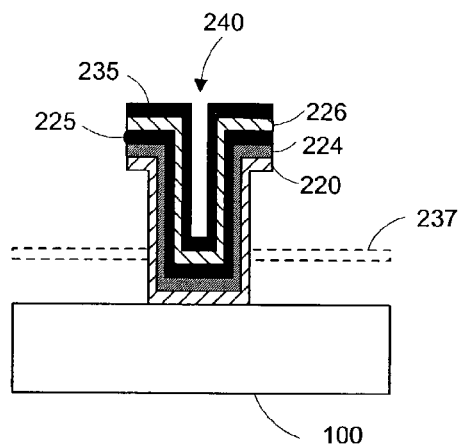
FIG. 9a is a side view of a micromirror device during a fabrication process according to an embodiment of the invention.

Alternative to defining the OFF angle and ON angle using the substrates, the OFF angle and ON angle can also be defined using stops and electrodes, as shown in FIGS. 7a through 7c. As can be seen in FIG. 7a, micromirror 24 is connected to substrate 110 via post 22, hinge 18c, post 16c and metal areas 12c. The micromirror as shown in FIG. 9A is not deflected, as no voltages are applied to any underlying electrodes (discrete metal areas formed in the above-described process) e.g., electrodes 18b or 12d. This non-deflected position is not the OFF position for the micromirror, which for projection systems is generally the furthest angle away from the ON position (in order to achieve the best contrast ratio for the projected image). The ON state of the micromirror, that is, the position of the micromirror that deflects light into the acceptance cone of the collection optics, is illustrated in FIG. 7b. A voltage $V_A$ is applied to electrode 12d in order to electrostatically pull down micromirror plate 24 until the edge of plate 24 impacts electrode 12e. Both micromirror plate 24 and electrode 12e are at the same potential, in this example at a voltage of $V_0$. As illustrated in FIG. 7c, when a voltage $V_B$ is applied to electrode 18b, micromirror plate 24 deflects in an opposite direction, with its movement being stopped by electrode 18a. Both electrode 18a and micromirror plate 24 are at the same potential (in this example a $V_0$ voltage). Depending upon the size of electrode 18b vs. electrode 12d, and the distance between these electrodes and the micromirror plate 24, the voltages applied to electrodes 18b and 12d need not be the same. This deflected position illustrated in FIG. 7c is the OFF position, and deflects light furthest away from the collection optics.

As can be seen by comparing FIGS. 7b and 7c the OFF position forms a lower angle (relative to the substrate) than the ON position. The benefits of such asymmetry will be discussed in further detail below. In one example of the invention, the ON position is from 0 to +30 degrees and the OFF position is from 0 to −30, with movement to the ON position being greater than movement to the OFF position. For example, the ON position could be from +10 to +30 degrees (or +12 to +20 degrees or +10 to +15 degrees) and the OFF position could be greater than 0 and between 0 and −30 degrees (or within a smaller range of between 0 and −10 or −12, or from −1 to −12, or −1 to −10 or −11 degrees, or −2 to −7 degrees). In another example, the micromirrors are capable of rotating at least +12 degrees to the ON position and between −4 and −10 degrees to the OFF position. Depending upon the materials used for the hinges, greater angles could be used achieved, such as an ON rotation from +10 to +35 degrees and an OFF rotation from −2 to −25 degrees (of course materials fatigue and creep can become an issue at very large angles). Not taking into account the direction of rotation, it is preferred that the ON and OFF positions are at angles greater than 3 degrees but less than 30 degrees relative to the substrate, preferably the ON position is greater than +10 degrees, and that the mirrors rotate 1 degree (or more) further in the ON direction than in the opposite OFF direction. Note that the hinge need not to be attached off center to the mirror plate—the same asymmetry of rotation could be achieved simply by having one stop disposed further away from the substrate from the other.

Figure 8A:
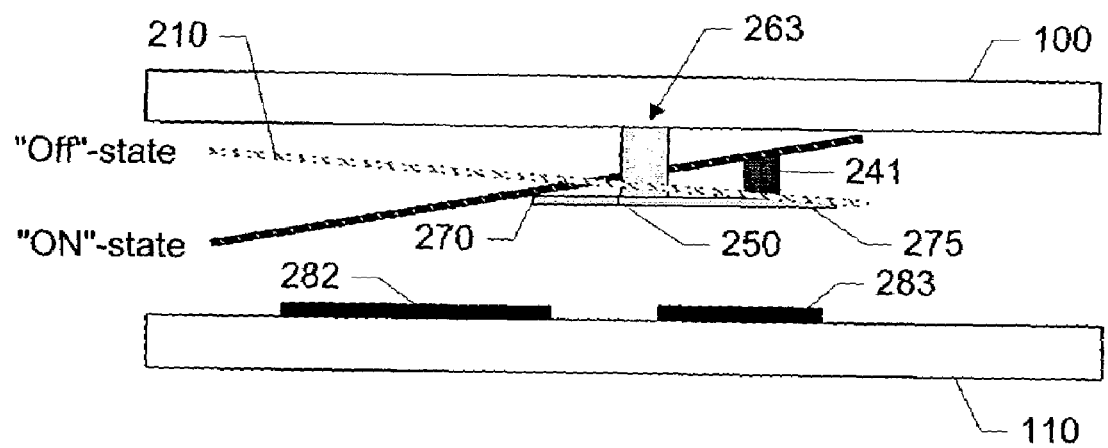
FIG. 8a is a cross-section view of a micromirror device having two stops defining an ON state and an OFF state of the micromirror device, and two electrodes driving the mirror plate to rotate to the ON state and the OFF state according to another embodiment of the invention.

Alternative to forming the stop mechanisms on the substrate, stops can also be formed on the mirror structure, e.g. on the hinge structure, as shown in FIGS. 8a through 8d. Referring to FIG. 8a, micromirror plate 210 is attached to hinge 241. Hinge 241 is held by hinge structure 263 that is formed on glass substrate 100, which is transparent to visible light. Hinge structure 263 further comprises stop 270 and stop 275, which respectively define the ON state OFF state angles for mirror plate 210. Specifically, the mirror plate reaches its ON state when the mirror plate hits stop 270. Similarly, the mirror plate reaches the OFF state when it is stopped by stop 275. Electrodes 282 and 283 on substrate 110 are disposed proximate to micromirror 264 for electrostatically deforming the mirror plate in opposite rotation directions, as shown in the figure.

Figure 8B:
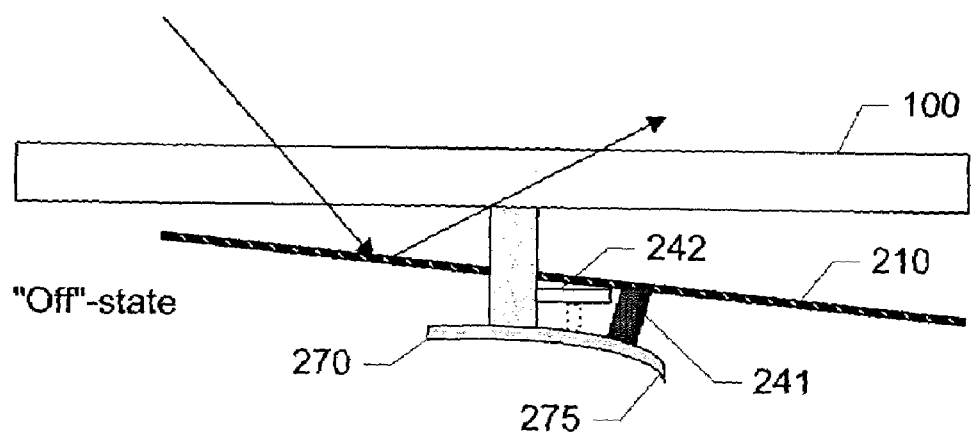
FIG. 8b is a cross-section view of a micromirror device having an OFF state that is non-flat and non-deflected state of the micromirror plate.

According to an aspect of the invention, the OFF state can be defined as the mirror plate staying at its non-deflected state, as shown in FIG. 8b. Referring to FIG. 8b, hinge structure 263 has a portion that is curved away from substrate 100 at the natural resting state. Micromirror plate 210, which is attached to the curved hinge structure, presents a finite angle relative to substrate 100 without external force (e.g. external electrical field). By adjusting the curvature of the hinge structure portion, a desired angle between the micromirror plate and the substrate can be achieved. In this situation, electrode 283 designated for driving the mirror plate rotating to the OFF state can be removed. As an alternative feature of the embodiment, the OFF state can be defined as mirror plate 210 being stopped by stop 242. Stop 242 can be formed on the posts of hinge structure 263 as shown in the figure. Alternatively, stop 242 can also be formed on the hinge support, on which the hinge is formed, which is show as the dashed line in FIG. 8b.

As shown in FIG. 8a, electrode 283 is designated for driving the mirror plate to rotate to the OFF state. Alternatively, this electrode for the OFF state can be substituted by an electrode film deposited on the lower surface of the glass substrate, as shown in FIG. 8c. Referring to FIG. 8c, electrode film 272 is deposited on the lower surface of glass substrate 100. Electrode film 272 is transmissive to visible light, and electrically conducting. Of course, the anti-reflection film can be a separate layer as electrode film 272, and can be deposited on either surface of the glass substrate. In operation, an electric voltage is applied to the electrode film on the glass substrate, yielding an electric field between the electrode film and the mirror plates. In response to this electric field, the mirror plates rotates relative to the substrate and stops when it hits stop 275, which defined the OFF state of the mirror plate. Electrode 282 on substrate 110 is provided for the ON state of the mirror plate. By applying an electric potential to electrode 282, an electric field is established between the mirror plate and electrode 282. When the electric force between the mirror plate and electrode 282 overcomes the electric force between the mirror plate and electrode film 272, mirror plate 210 rotates to the ON state. As an example, 0 volt and 18 volts can be applied to electrode 282 for the OFF state and the ON state, respectively. Mirror plate 210 always stays at 30 volts, and electrode film always stays at 18 volts for keeping the non-actuated mirror plates in the OFF state. Of course the voltages mentioned herein are an example only, and can be selected based on the gaps and relative gaps between the electrodes and mirror plate, hinge shape and hinge material, etc.

In another embodiment of the invention, a separate electrode (e.g. electrode 267) other than electrode 282 is provided for obtaining the OFF state for the mirror plate. Referring to FIG. 8d, electrode 267 is formed on glass substrate 100 (in the form of strips or a grid as shown in FIG. 2). By establishing an electric field between electrode 267 and mirror plate 210, mirror plate 210 rotates relative to the substrate in the OFF state angle direction. This rotation can be stopped by stop 275 that defines the OFF state. In this situation, electrode 267 is electrically conducting. Alternatively, the rotation can be stopped by electrode 267 itself. In this situation, electrode 267 is coated with a dielectric material to avoid electric shorting between the mirror plate and electrode 267.

The micromirror device mentioned above can be fabricated in many ways, such as those disclosed in U.S. Pat.

Nos. 5,835,256 and 6,046,840 to Huibers, the subject matter of each being incorporated herein by reference. A demonstrative process for forming a micromirror device of the present invention will be discussed in the following. U.S. patent applications Ser. Nos. 09/910,537 filed Jul. 20, 2001, and 60/300,533 filed Jun. 22, 2001 both to Reid contain examples of materials that may be used for the various components of the current invention. These applications are incorporated herein by reference. It should be appreciated by those ordinary skills in the art that the exemplary processes are for demonstration purpose only and should not be interpreted as limitations.

Referring to FIG. 9a, substrate 100 is provided. Mirror plate 237 is formed on substrate 100 by depositing a first sacrificial layer (e.g. amorphous silicon) on the substrate and then depositing the mirror plate layer on the first sacrificial layer followed by patterning the deposited mirror player as desired. The substrate can be a glass (e.g. 1737F, Eagle 2000), quartz, Pyrex™, sapphire. The first sacrificial layer may be any suitable material, such as amorphous silicon, or could alternatively be a polymer or polyimide, or even polysilicon, silicon nitride, silicon dioxide, etc. depending upon the choice of sacrificial materials, and the etchant selected. In one embodiment the sacrificial layer comprises tungsten—such as elemental tungsten or tungsten nitride. If the first sacrificial layer is amorphous silicon, it can be deposited at 300–350° C. The thickness of the first sacrificial layer can be wide ranging depending upon the micromirror size and desired title angle of the micro-micromirror, though a thickness of from 500 Å to 50,000 Å, preferably around 25,000 Å, is preferred. The first sacrificial layer may be deposited on the substrate using any suitable method, such as LPCVD or PECVD. As an alternative feature of the embodiment, an anti-reflection film (not shown) maybe deposited on the surface of the substrate. The anti-reflection layer is deposited for reducing the reflection of the incident light from the surface of the substrate. Alternatively, other optical enhancing layers, UV filter layers, IR filter layers, etc. may be deposited on either surface of the glass substrate as desired. Because the micromirror is designated for reflecting incident light in the spectrum of interest (e.g. visible light spectrum), it is preferred that the micromirror plate layer comprises of one or more materials that exhibit high reflectivity (preferably 90% or higher) to the incident light. Exemplary materials for the mirror plate are Al, Ti, AlSiCu and TiAl. In depositing the micromirror plate layer, PVD is preferably used at 150° C. The thickness of the micromirror plate layer can be wide ranging depending upon the desired mechanical (e.g. elastic module), the size of the micromirror, desired titled angle and electronic (e.g. conductivity) properties of the micromirror plate and the properties of the materials selected for forming the micromirror plate. According to the invention, a thickness of from 500 Å to 5,000 Å, preferably around 2,500 Å, is preferred. In patterning the micromirror plate layer, a standard photoresist patterning technique followed by etching using, for example CF4, Cl2, or other suitable etchant depending upon the specific material of the micromirror plate layer can be employed. The mirror plate can be patterned into any desired shapes, such as those shown in FIG. 10a, FIG. 10b and FIG. 11.

Figure 9B:
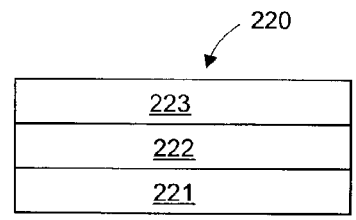
Figure 9C:
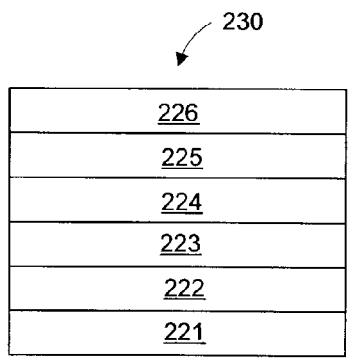
Figure 9D:
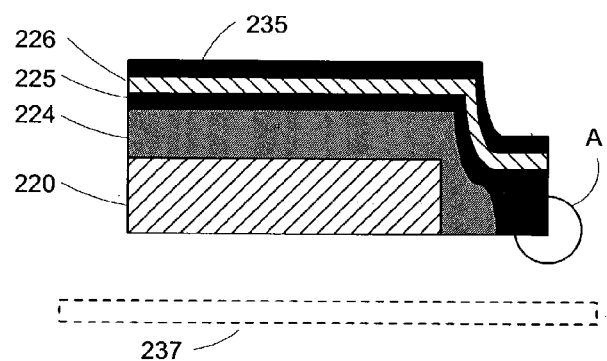
Figure 9E:
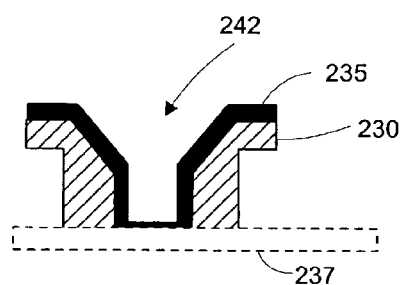
Figure 9F:
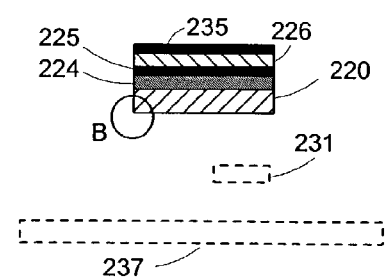
Figure 10A:
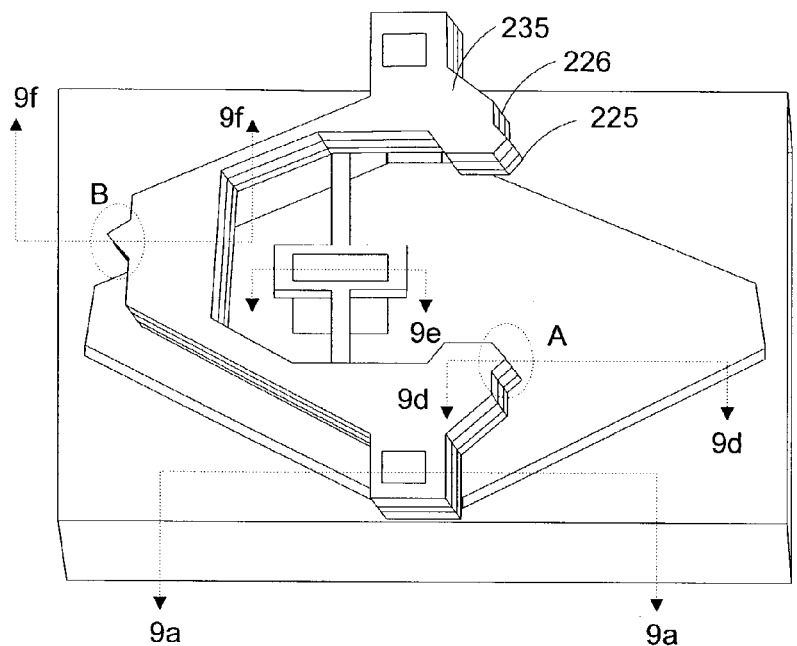
FIG. 10a illustrates a hinge structure, a micromirror plate and a substrate of a micromirror device, wherein the hinge structure is used as an electrode for the OFF state of the micromirror plate according to an embodiment of the invention.

Referring back to FIGS. 9a–9f, on the patterned mirror plate 237, a second sacrificial layer is deposited followed by patterning the second sacrificial layer to form deep via 240 (see FIGS. 9a and 10a) and shallow via 242 (see FIGS. 9e and 10a). The second sacrificial layer may comprise amorphous silicon, or could alternatively comprise one or more of the various materials mentioned above in reference to the first sacrificial layer. First and second sacrificial layers need not be the same, though are the same in the preferred embodiment so that, in the future, the etching process for removing these sacrificial layers can be simplified. Similar to the first sacrificial layer, the second sacrificial layer may be deposited using any suitable method, such as LPCVD or PECVD. If the second sacrificial layer comprises amorphous silicon, the layer can be deposited at 350° C. The thickness of the second sacrificial layer can be on the order of 10,000 Å, but may be adjusted to any reasonable thickness, such as between 2000 Å and 20,000 Å depending upon the desired distance (in the direction perpendicular to the micromirror plate and the substrate) between the micromirror plate and the hinge. It is preferred that the hinge and mirror plate be separated by a gap after release of at least 0.5 um (this can be at least 1 um or even 2 um or more if desired). The second sacrificial layer may also fill in the trenches left from the patterning of the micromirror plate.

After patterning the second sacrificial layer, layer 220 is deposited and patterned. In the embodiment of the invention, layer 220 is a triple-layered structure, which further comprises layers 221, 222 and 223, as shown in FIG. 9b. In a preferred embodiment of the invention, layer 221 is a dielectric such as $SiN_x$ with a preferred thickness around 400 angstroms. Layer 222 is electrically conductive such as $TiN_x$ with a preferred thickness around 400 angstroms. Layer 222 will be used as the electrode for the OFF state of the mirror plate. And layer 223 is also a dielectric such as $SiN_x$ with a preferred thickness around 400 angstroms. These three layers can be deposited and patterned simultaneously for the ON angle contact area (FIG. 9d) but not for the post areas (FIG. 9a), or OFF angle contact area (FIG. 9f). After depositing and patterning, these three layers fill deep via 240 and shallow via 242 with the bottom segment of shallow via 242 exposed to mirror plate 237 (by etching—see FIG. 9e). On layer 220, layer 224, which is preferably a dielectric such as $SiN_x$ with a preferred thickness around 400 angstroms is deposited (and patterned at ON angle contact area in FIG. 9d). This is for insulating layer 222 within layer 220 from following layer 225. Then layer 225 is deposited, which is preferably an electrically conductive material such as $TiN_x$ with a preferred thickness around 200 angstroms. After depositing layer 225, layer 226, which is preferably a dielectric such as $SiN_x$ with a preferred thickness around 3000 angstroms, is deposited. Following layer 226, layer 235 is deposited which is the hinge layer and is preferably electrically conductive single or multilayer structure. Then, layers 225, 226 and 235 are patterned together (FIG. 9d) or all of layers 220, 224, 226 and 235 are patterned in post and OFF angle contact areas (FIGS. 9a and 9f). Contact point A in FIG. 9d has an electrically conductive contact area on layer 225 as can be seen in FIG. 9d. Hinge layer 235 is electrically conducting. It can be seen that, layer 222 and layers 225/235 are electric conducting layers; layer 222 acts as an electrode for deforming the mirror plate to the OFF state, and layers 225/235 connect the mirror plate via the shallow via to apply an electric potential. In operation, layers 222 and 225/235 are applied with different electric potentials. Finally, the first sacrificial layer between the substrate and the mirror plate, and the second sacrificial layer between the mirror plate and layer 220 are removed using, for example, suitable spontaneous vapor phase chemical etchant, such as xenon difluoride. During etching, other suitable gaseous materials, such as inert gas (e.g. He, $N_2$, Ar and Xe) may also be mixed with the xenon difluoride. Alternatively, the etchant can be interhalogen or inert gas halide. In addition to the above etchants and etching methods mentioned for use in either the final release or in an intermediate etching step, there are others that may also be used by themselves or in combination. Some of these include wet etches, such as ACT, KOH, TMAH, HF (liquid); oxygen plasma, $SCCO_2$, or super critical $CO_2$ (the use of super critical $CO_2$ as an etchant is described in U.S. patent application Ser. No. 10/167,272, which is incorporated herein by reference). Of course, the etchants and methods selected should be matched to the sacrificial materials being removed and the desired materials being left behind.

In the embodiment of the invention, point A defines the ON state for mirror plate 237 as the rotation of the mirror plate is stopped by point A. Point B defines the OFF state for the micromirror plate. Alternatively, a separate stop 231 for the OFF state can be formed as shown in figure. As an aspect of the invention, stop 231 can also be used as an electrode for driving the mirror plate to rotate to the OFF state. When stop 231 is used as both stop and electrode, it is preferred that stop 231 comprises a layer of a dielectric material to avoid electric shorting.

Figure 10B:
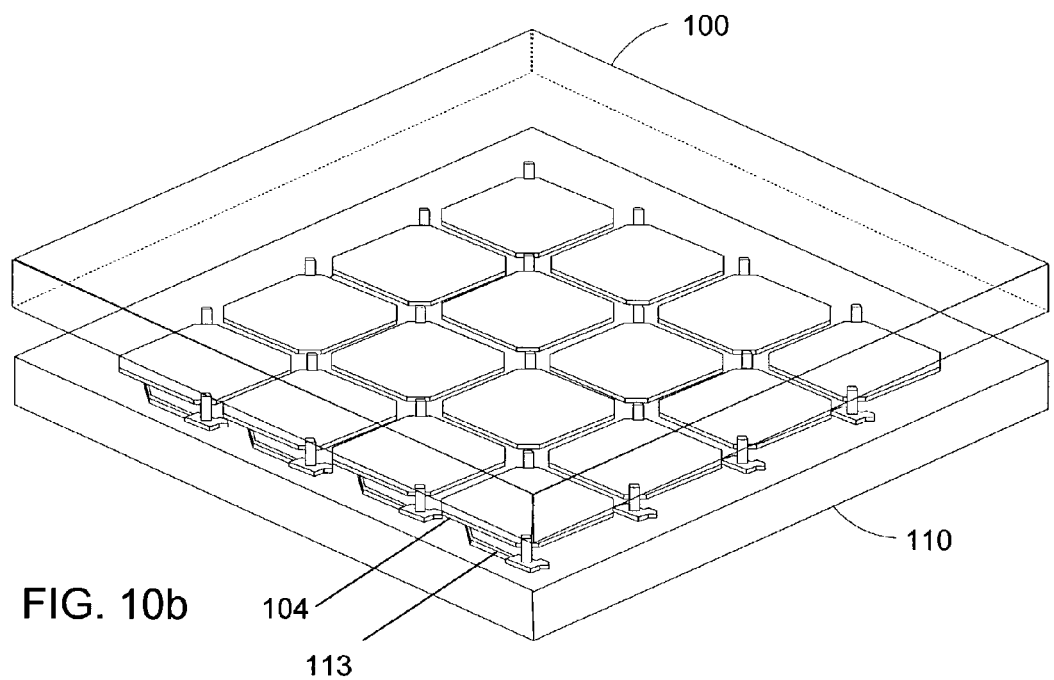

Referring to FIG. 10a, a portion of the micromirror device after removing the first and second sacrificial layers is illustrated therein. As can be seen, the conducting layer 222 and layers 225 and 235 are separated by insulating layer 224. FIG. 10b illustrates a micromirror array 104 having an array of micromirror devices of FIG. 10a formed on glass substrate 100 that is transparent to visible light. Another substrate 110 having an array of electrode 113 and circuitry (not shown) are disposed proximate to the micromirror array for electrostatically deforming the micromirrors.

Figure 11:
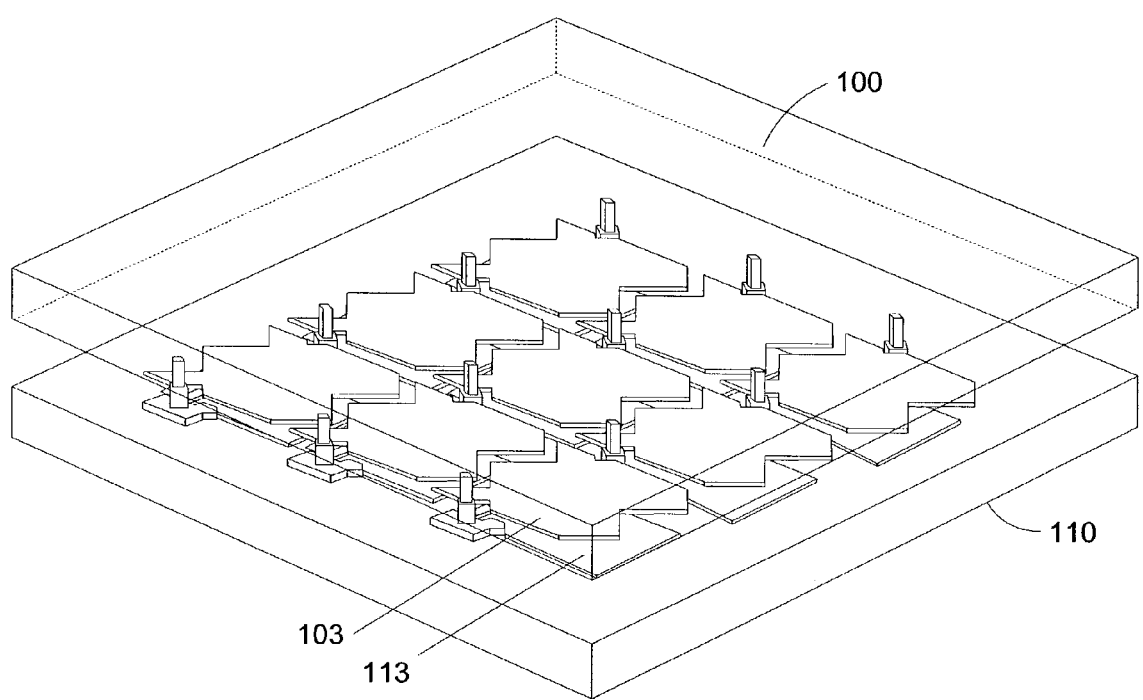
FIG. 11 schematically illustrates another micromirror array device having an array of micromirrors.

Referring to FIG. 11, another micromirror array device is illustrated therein. The micromirror array device comprises an array of micromirrors 103 formed on glass substrate 100 that is transparent to visible light. Substrate 110, which comprises an array of electrodes 113 and circuitry (not shown), is disposed approximate to the micromirror array 103 for electrostatically deforming the micromirrors.

Figure 12:
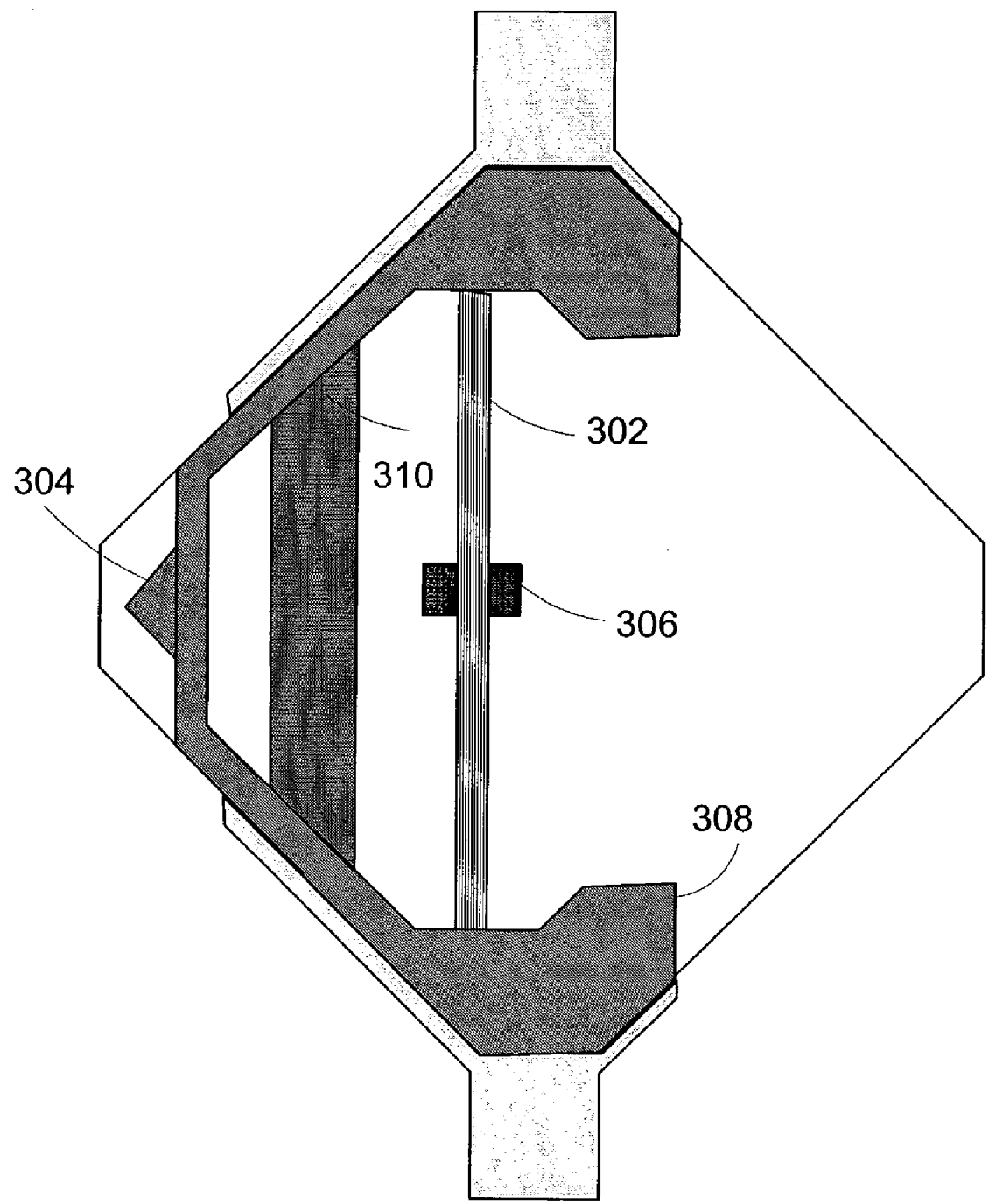
FIG. 12 illustrates a top view of a micromirror device having a stop and an electrode formed on the hinge structure for the OFF state of the micromirror device.

In addition to forming the electrode and the stop both for the OFF state of the mirror plate continuously on the hinge structure, the electrode and the stop for the OFF state can be formed separately, as shown in FIG. 12. Referring to FIG. 12, stop 304 and electrode 310, which are designated for the OFF state of the mirror plate are formed separately on the hinge structure. A tip structure 308 acts as a stop for the ON state of the mirror plate.

Figure 13A:
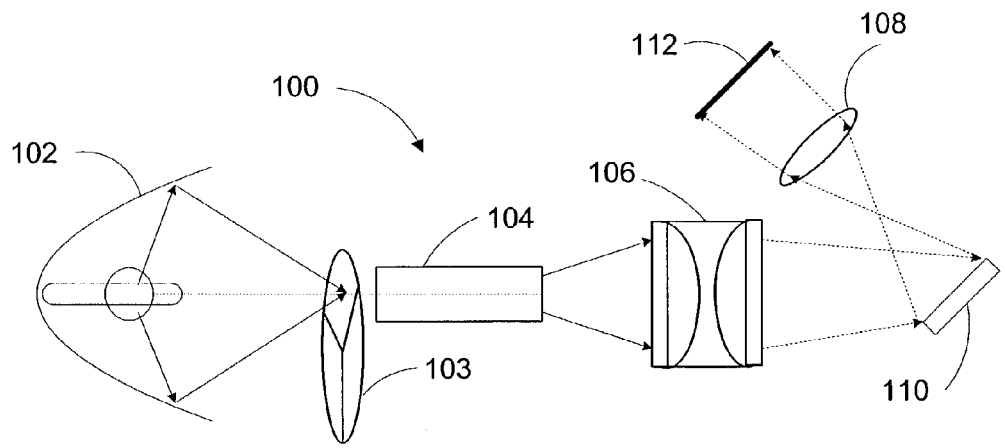
FIG. 13a and FIG. 13b respectively illustrate two exemplary display systems, one employing one spatial light modulator and the other one employing three spatial light modulators, each of which is designated for modulating one of the three primary colors, i.e. green, red and blue.

The micromirror device of the present invention has a variety of applications (e.g. maskless lithography, atomic spectroscopy, maskless fabrication of micromirror arrays, signal processing, microscopy etc), one of which is in display systems. FIG. 13a presents a simplified exemplary display system that employs a spatial light modulator comprising an array of micromirrors of the invention. In its very basic configuration, display system 100 comprises light source 102, optical devices (e.g. light pipe 104, condensing lens 106 and projection lens 108), display target 112 and spatial light modulator 110 that further comprises a plurality of micromirror devices (e.g. an array of micromirror devices). Light source 102 (e.g. an arc lamp) emits light through the light integrator/pipe 104 and condensing lens 106 and onto spatial light modulator 110. The micromirrors of the spatial light modulator 110 are selectively actuated by a controller (e.g. as disclosed in U.S. Pat. No. 6,388,661 issued May 14, 2002 incorporated herein by reference) so as to reflect—when in their "ON" position—the incident light into projection optics 108, resulting in an image on display target 112 (screen, a viewer's eyes, a photosensitive material, etc.). Generally, more complex optical systems are often used, especially in displaying applications for color images, such as display systems in FIG. 13b.

Figure 13B:
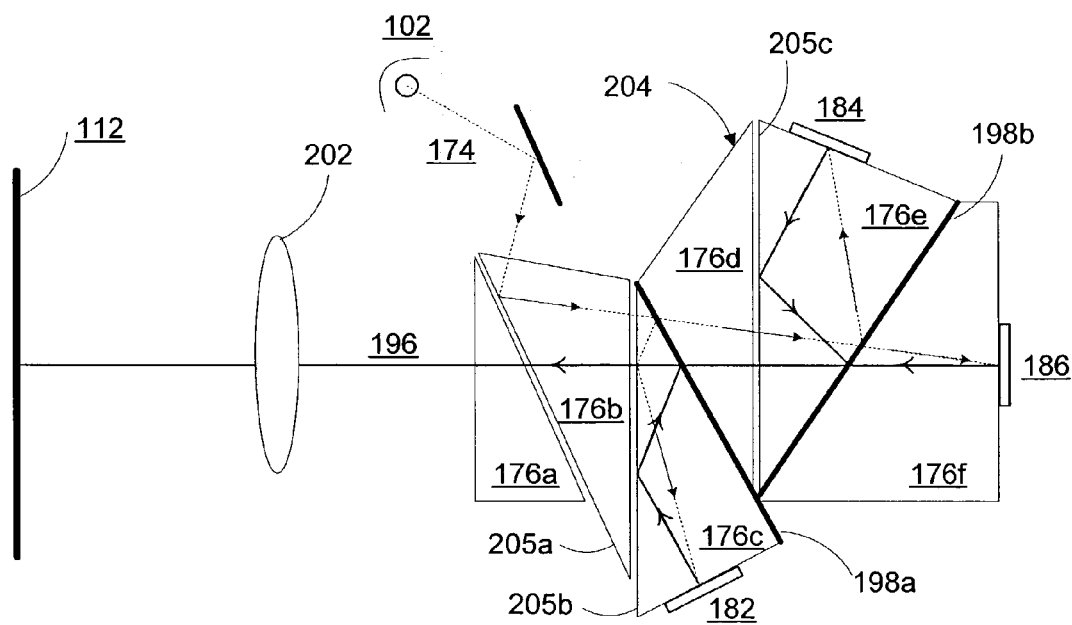

Referring to FIG. 13b, a display system employing three spatial light modulators, each being designated for modulating one of the three primary colors (i.e. green, red and blue) and each comprising an array of micromirrors of the present invention is illustrated therein. The display system comprises a dichroic prism assembly 204 for splitting incident light into three primary color light beams. Dichroic prism assembly comprises prisms 176a, 176b, 176c, 176d, 176e and 176f. Totally-internally-reflection (TIR) surfaces, i.e. TIR surfaces 205a, 105b and 205c, are defined at the prism surfaces that face air gaps. The surfaces 198a and 198b of prisms 176c and 176e are coated with dichroic films, yielding dichroic surfaces. In particular, dichroic surface 198a reflects green light and transmits other light. Dichroic surface 198b reflects red light and transmits other light. The three spatial light modulators, 182, 184 and 186, each having a micromirror array device, are arranged around the prism assembly.

Regardless of whether the optical system utilizes a single micromirror array device as in FIG. 1a, or multiple micromirror array devices as in FIGS. 1b and 1c, reflection from light transmissive substrates is preferably minimized. In operation, incident white light 174 from light source 102 enters into prism 176b and is directed towards TIR surface 205a at an angle larger than the critical TIR angle of TIR surface 205a. TIR surface 205a totally internally reflects the incident white light towards spatial light modulator 186, which is designated for modulating the blue light component of the incident white light. At the dichroic surface 198a, the green light component of the totally internally reflected light from TIR surface 205a is separated therefrom and reflected towards spatial light modulator 182, which is designated for modulating green light. As seen, the separated green light may experience TIR by TIR surface 205b in order to illuminate spatial light modulator 182 at a desired angle. This can be accomplished by arranging the incident angle of the separated green light onto TIR surface 205b larger than the critical TIR angle of TIR surface 205b. The rest of the light components, other than the green light, of the reflected light from the TIR surface 205a pass through dichroic surface 198a and are reflected at dichroic surface 198b. Because dichroic surface 198b is designated for reflecting red light component, the red light component of the incident light onto dichroic surface 198b is thus separated and reflected onto spatial light modulator 184, which is designated for modulating red light. Finally, the blue component of the white incident light (white light 174) reaches spatial light modulator 186 and is modulated thereby. By collaborating operations of the three spatial light modulators, red, green and blue lights can be properly modulated. The modulated red, green and blue lights are recollected and delivered onto display target 112 through optic elements, such as projection lens 202, if necessary.

It will be appreciated by those of skill in the art that a new and useful spatial light modulator has been described herein. In view of the many possible embodiments to which the principles of this invention may be applied, however, it should be recognized that the embodiments described herein with respect to the drawing figures are meant to be illustrative only and should not be taken as limiting the scope of invention. For example, those of skill in the art will recognize that the illustrated embodiments can be modified in arrangement and detail without departing from the spirit of the invention. Therefore, the invention as described herein contemplates all such embodiments as may come within the scope of the following claims and equivalents thereof.

We claim:

1. A spatial light modulator comprising:
    a semiconductor substrate;
    a light transmissive substrate that is transmissive to visible light;
    an array of micromirrors, each micromirror comprising:
        a reflective mirror plate held by a hinge;
        an addressing electrode and a light transmissive electrode for moving the mirror plate between an ON and OFF position; the ON position being at a positive angle relative to a non-deflected position of the reflective mirror plate; and the OFF position being at a negative angle relative to the non-deflected position of the reflective mirror plate;
    wherein the addressing electrode is disposed on the semiconductor substrate; and the light transmissive electrode is disposed on the light transmissive substrate; and
    wherein a plurality of mirror plates of the micromirror array shares the light transmissive electrode.

2. The spatial light modulator of claim 1, wherein the ON position is at an angle of 10 degrees or more from the non-deflected position.

3. The spatial light modulator of claim 2, wherein the OFF position is at an angle of −1 to −8 degrees from the non-deflected position.

4. The spatial light modulator of claim 1, wherein the OFF position is at an angle of from −1 to −8 degrees from the non-deflected position.

5. The spatial light modulator of claim 4, wherein the OFF position is at an angle of from −2 to −6 degrees from the non-deflected position.

6. The spatial light modulator of claim 5, wherein the OFF position is at an angle of from −3 to −5 degrees.

7. The spatial light modulator of claim 5, wherein the ON position is at an angle of from 14 to 18 degrees.

8. The spatial light modulator of claim 1, wherein the ON angle is 10 degrees or more and the OFF angle is a negative angle and less than 10 degrees.

9. The spatial light modulator of claim 1, wherein the hinge is connected to the mirror plate at a point not at the center of the mirror plate.

10. The spatial light modulator of claim 9, wherein the hinge is disposed in the same plane of the mirror plate.

11. The spatial light modulator of claim 1, wherein the hinge is disposed in a different plane from the minor plate.

12. The spatial light modulator of claim 1, wherein the light transmissive electrode is a conductive film strip that extends along a row or column of the micromirrors.

13. The spatial light modulator of claim 1, wherein the light transmissive electrode is a conductive grid used for applying an electric field to all micromirrors at a time.

14. The spatial light modulator of claim 1, wherein when the addressing electrodes actuate a first group of micromirrors, a voltage from the light transmissive electrode deflects micromirrors not in the first group.

15. The spatial light modulator of claim 1, wherein the reflective plate abuts the semiconductor substrate at the ON position.

16. The spatial light modulator of claim 1, wherein the reflective mirror plate abuts a protrusion in the ON state, the protrusion disposed with a gap between the addressing and light transmissive electrodes.

17. The spatial light modulator of claim 16, wherein the protrusion is connected to a post which holds the micromirror on the light transmissive substrate.

18. The spatial light modulator of claim 16, wherein the reflective mirror plate abuts an electrically conductive layer of the protrusion.

19. The spatial light modulator of claim 18, wherein the electrically conductive layer comprises an early transition metal oxide or nitride.

20. The spatial light modulator of claim 1, wherein the reflective mirror plate abuts the light transmissive substrate in the OFF position.

21. The spatial light modulator of claim 1, wherein the reflective mirror plate abuts a protrusion in the OFF state, the protrusion disposed with a gap between the mirror plate and said addressing electrode.

22. The spatial light modulator of claim 21, wherein the protrusion is connected to a post which holds the micromirror to the light transmissive substrate.

23. The spatial light modulator of claim 21, wherein the reflective plate abuts an electrically conductive layer of the protrusion.

24. The spatial light modulator of claim 23, wherein the electrically conductive layer comprises an early transition metal oxide or nitride.

25. The spatial light modulator of claim 1, comprising an ON state stop and on OFF state stop, each stop being connected to the posts formed on the light transmissive substrate.

26. The spatial light modulator of claim 25, wherein the ON state and OFF state stops are disposed in the same plane.

27. The spatial light modulator of claim 25, wherein the ON state and OFF state stops are disposed in different planes.

28. The spatial light modulator of claim 1, wherein then light transmissive electrode is an anti-reflective coating on the light transmissive substrate for reducing reflections of visible light incident thereto.

29. The spatial light modulator of claim 1, wherein then light transmissive electrode is an electrically conductive layer within a multi-layer anti-reflective coating on the light transmissive substrate.

* * * * *